(12) United States Patent
Turner

(10) Patent No.: US 11,293,812 B2
(45) Date of Patent: Apr. 5, 2022

(54) ADAPTIVE FILTER BANK FOR MODELING A THERMAL SYSTEM

(71) Applicant: Schneider Electric USA, Inc., Boston, MA (US)

(72) Inventor: Larry A. Turner, Chapel Hill, NC (US)

(73) Assignee: Schneider Electric USA, Inc., Boston, MA (US)

( * ) Notice: Subject to any disclaimer, the term of this patent is extended or adjusted under 35 U.S.C. 154(b) by 183 days.

(21) Appl. No.: 16/519,751

(22) Filed: Jul. 23, 2019

(65) Prior Publication Data

US 2021/0025766 A1 Jan. 28, 2021

(51) Int. Cl.

| | |
|---|---|
| *G01K 7/42* | (2006.01) |
| *G06F 30/20* | (2020.01) |
| *G01F 1/86* | (2006.01) |
| *G01K 1/022* | (2021.01) |
| *H03H 17/04* | (2006.01) |
| *H03H 17/00* | (2006.01) |

(52) U.S. Cl.
CPC .............. *G01K 7/427* (2013.01); *G01F 1/86* (2013.01); *G01K 1/022* (2013.01); *G06F 30/20* (2020.01); *H03H 17/04* (2013.01); *H03H 2017/009* (2013.01)

(58) Field of Classification Search
CPC ........ G01K 7/427; G01K 1/022; G06F 30/20; G01F 1/86; H03H 17/04; H03H 2017/009; H03H 21/0012; H03H 2021/0087; G05B 17/02; G05D 23/1917
See application file for complete search history.

(56) References Cited

U.S. PATENT DOCUMENTS

| | | | |
|---|---|---|---|
| 5,777,914 A * | 7/1998 | Larsson ................. | H03H 17/02 708/322 |
| 6,501,329 B1 * | 12/2002 | Petrofsky ........... | H03H 17/0294 327/552 |
| 10,254,726 B2 | 4/2019 | Buda et al. | |
| | (Continued) | | |

OTHER PUBLICATIONS

Extended European Search Report dated Dec. 16, 2020 for European Patent Application No. 20182966.0 (7 pages).

*Primary Examiner* — Mohammad K Islam
(74) *Attorney, Agent, or Firm* — Locke Lord LLP

(57) ABSTRACT

Embodiments of the disclosure implement an application of an adaptive filter bank that is used to characterize the heat transfer of a volume in a thermal system, to estimate temperature and power consumption, and to improve performance characteristics in applications including optimal temperature control and diagnostics. In some embodiments, the adaptive filter bank is an iterative solution, comprised of a collection of adaptive filters defined to consume incident signals, produce an aggregate reference signal, estimate an error relative to an observed primary signal, and modify thermal coefficients to converge on a solution. For example, the incident signals are comprised of properties related to active, passive, solar irradiance, and unobserved heat transfer. A reference signal is an estimate of a primary signal, related to the rate of heat transfer or temperature change. Thereupon, the thermal coefficients are modified in an adaptive process to include gradient descent, which minimizes estimation error.

20 Claims, 12 Drawing Sheets

(56) References Cited

U.S. PATENT DOCUMENTS

| | | | |
|---|---|---|---|
| 10,316,643 B2* | 6/2019 | Chen | E21B 47/135 |
| 10,352,884 B2 | 7/2019 | Turner et al. | |
| 10,491,996 B2* | 11/2019 | De Milleri | H04R 3/04 |
| 2003/0005009 A1* | 1/2003 | Usman | G06F 17/18 |
| | | | 708/322 |
| 2008/0250090 A1* | 10/2008 | Eitel | H03H 21/0012 |
| | | | 708/201 |
| 2011/0257926 A1 | 10/2011 | Stabler et al. | |
| 2015/0300888 A1* | 10/2015 | Chen | G01K 7/42 |
| | | | 702/133 |
| 2016/0223214 A1* | 8/2016 | Turner | F24F 11/62 |
| 2016/0223216 A1 | 8/2016 | Buda et al. | |
| 2016/0223217 A1 | 8/2016 | Buda et al. | |
| 2016/0327295 A1 | 11/2016 | Ward et al. | |
| 2017/0074534 A1 | 3/2017 | Turner | |
| 2018/0285729 A1* | 10/2018 | Nakano | G06N 3/082 |
| 2020/0323435 A1* | 10/2020 | Selvaraj | A61B 5/6833 |
| 2021/0145290 A1* | 5/2021 | LeBoeuf | A61B 5/02433 |
| 2021/0151026 A1* | 5/2021 | Jain | G10K 11/1787 |

* cited by examiner

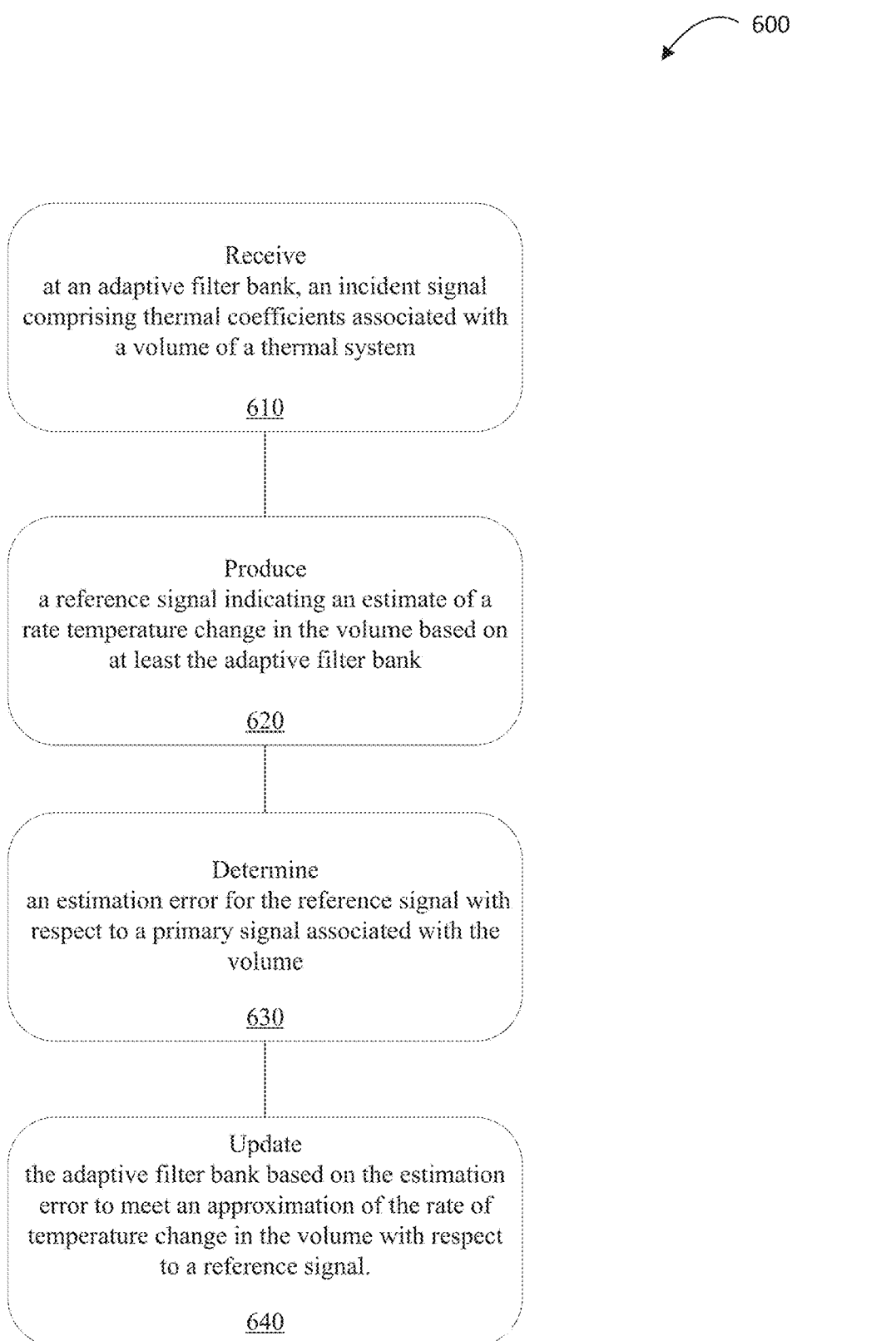

Receive
at an adaptive filter bank, an incident signal comprising thermal coefficients associated with a volume of a thermal system
610

Produce
a reference signal indicating an estimate of a rate temperature change in the volume based on at least the adaptive filter bank
620

Determine
an estimation error for the reference signal with respect to a primary signal associated with the volume
630

Update
the adaptive filter bank based on the estimation error to meet an approximation of the rate of temperature change in the volume with respect to a reference signal.
640

FIG. 6

ADAPTIVE FILTER BANK FOR MODELING A THERMAL SYSTEM

TECHNICAL FIELD

The disclosure relates to generally to thermal models, and more particularly, to an adaptive filter bank for characterizing heat transfer of a volume of a thermal system.

BACKGROUND

Users often use devices to control or modify the temperatures in certain sites, such as a residence. Such devices, however, may be unable to learn or express the heat transfer characteristics of a thermal system. Thermal models exploit observed physical relationships related to device properties and weather estimates to characterize heat transfer and predict temperature and power consumption, facilitating optimal temperature control, with improved thermal comfort and reduced power consumption.

BRIEF DESCRIPTION OF THE DRAWINGS

A more detailed description of the disclosure, briefly summarized above, can be had by reference to various embodiments, some of which are illustrated in the appended drawings. While the appended drawings illustrate select embodiments of this disclosure, these drawings are not to be considered limiting of its scope, for the disclosure can admit to other equally effective embodiments.

FIG. 6 is a flow diagram of another method of implementing an adaptive filter bank for modeling a thermal system according to an embodiment of the disclosure.

Identical reference numerals have been used, where possible, to designate identical elements that are common to the figures. However, elements disclosed in one embodiment can be beneficially utilized on other embodiments without specific recitation.

SUMMARY

Figure 1:
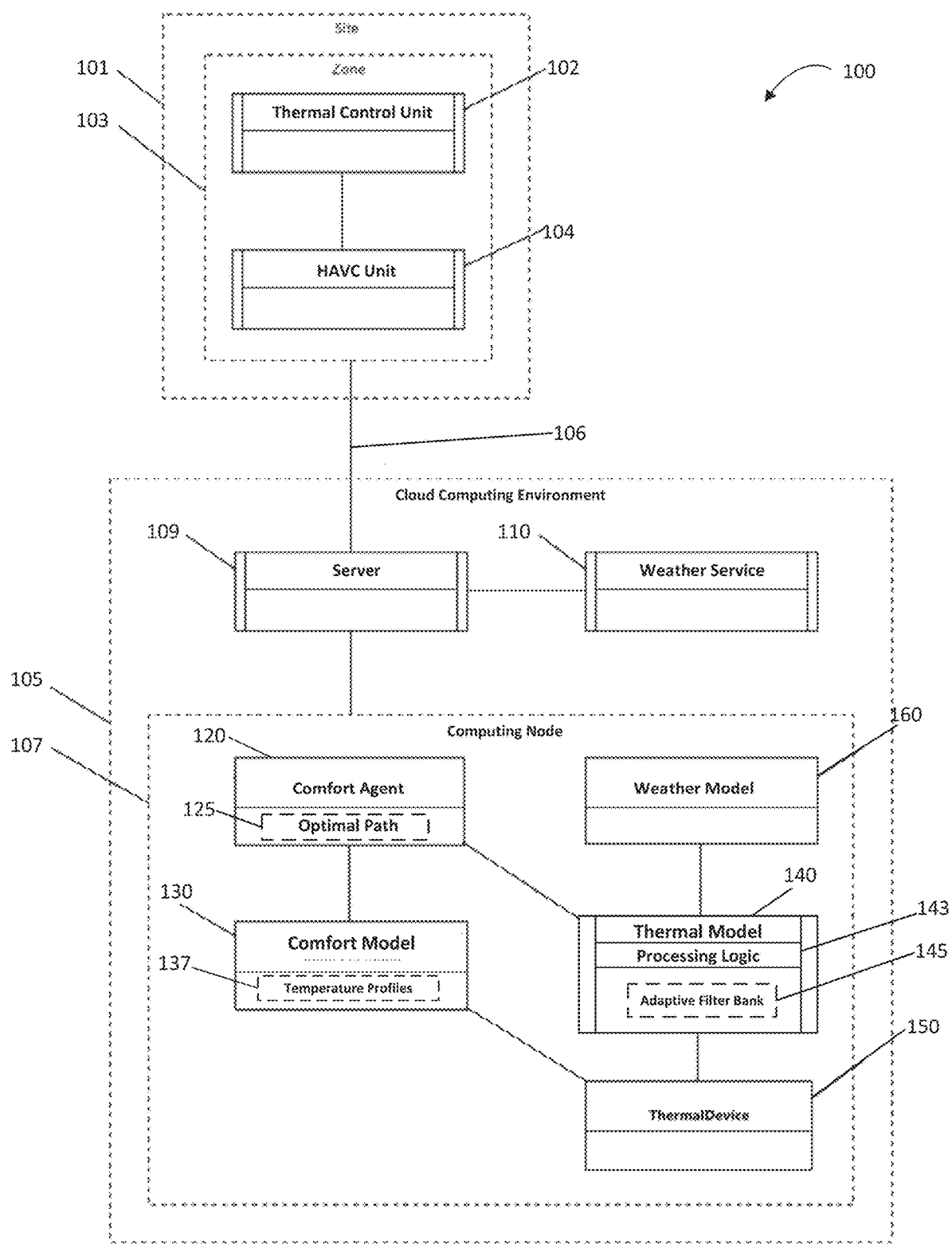
FIG. 1 is a block diagram illustrating a system architecture associated with a thermal system according to an embodiment of the disclosure.

In accordance with the disclosure, a thermal model solution is provided. The thermal model solution implements an adaptive filter bank to characterize heat transfer associated with one or more volumes of a thermal system. In implementations, the thermal models interact with one or more thermal devices in a zone and a weather model associated with a site, to construct, adapt, and verify, a set of thermal coefficients which characterize heat transfer and exploit the observed relationship between environmental conditions, including temperature, and power consumption. The thermal model requires no commissioning information to characterize heat transfer, but rather extracts information entirely from passive observation of data provided by the thermal devices and the weather model. For example, the thermal model uses the passive observations to determine the heat transfer data associated with site based on the relationships between environmental conditions, temperatures, power consumption and other type of physical characteristics associated with the zones. In some situations, certain information regarding the zones may be unknown or unreliably reported, such as the specific geometry of each zone and the thermal mass and heat transfer characteristics of boundary materials. This unknown or unreliable information can lead to errors in characterization of heat transfer, which can result in an inefficient or wasteful use of energy by the system for comfort-based management of site that is associated with the system architecture.

Implementations of the disclosure address the above-mentioned and other deficiencies by implementing an adaptive filter bank to minimize the estimation error that can occur when characterizing the heat transfer associated with one or more volumes of the thermal system. In one embodiment, a method is provided. The method includes receiving, by a controller device, thermal coefficient data at an adaptive filter bank to characterize heat transfer of a volume of a thermal system; generating, by the controller device, reference signal data indicating an estimate of a rate of temperature change in the volume based on at least the adaptive filter bank; receiving, by the controller device, primary signal data based at least on an observed rate of the temperature change in the volume; determining, by the controller device, an estimation error for the reference signal data with respect to the primary signal data associated with the volume; and modifying, by the controller device, the thermal coefficient data in view of the estimation error to satisfy a solution associated with the volume.

In another embodiment, a system is provided. The system includes a memory to store a plurality of thermal coefficient data; and a controller device, operatively coupled to the memory, to: receive thermal coefficient data at an adaptive filter bank to characterize heat transfer of a volume of a thermal system; generate reference signal data indicating an estimate of a rate of temperature change in the volume based on at least the adaptive filter bank; receive primary signal data based at least on an observed rate of the temperature change in the volume; determine an estimation error for the reference signal data with respect to the primary signal data associated with the volume; and modify the thermal coefficient data in view of the estimation error to satisfy a solution associated with the volume.

In yet another embodiment, a non-transitory computer-readable storage medium is provided. The non-transitory computer-readable storage medium includes executable instructions that when executed, by a controller device, cause the controller device to: receive, by the controller device, thermal coefficient data at an adaptive filter bank to characterize heat transfer of a volume of a thermal system; generate reference signal data indicating an estimate of a rate of temperature change in the volume based on at least the adaptive filter bank; receive primary signal data based at least on an observed rate of the temperature change in the volume; determine an estimation error for the reference signal data with respect to the primary signal data associated with the volume; and modify the thermal coefficient data in view of the estimation error to satisfy a solution associated with the volume.

In one example, the adaptive filter bank comprises a plurality of infinite impulse response filters. The solution indicates a convergence between the reference signal data and the primary signal data associated with the volume. Thermal coefficient data comprises data associated with at least one of: an active, passive, solar irradiance or unobserved heat transfer rate of the volume. In another example, the primary data is received based on a thermal control unit associated with the volume. In yet another example, generating the reference signal data further includes aggregating an estimate of the primary signal data for a determined time period; and inserting a delay in a signal path associated with the aggregated primary signal data. The estimation error is generated based on a difference between the reference signal data the primary signal data.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. Other features will be in part apparent and in part pointed out hereinafter.

DETAILED DESCRIPTION

Aspects of the disclosure generally relates to implementing a thermal model based on an adaptive filter bank to characterize the heat transfer of a volume of a thermal system. The techniques of the disclosure may use the adaptive filter bank to improve the performance characteristics, diagnostics, energy saving estimations and optimal temperature control (including optimal start and optimal stop) of applications for controlling desired temperatures in one or more volumes of the thermal system. In accordance with the disclosure, the adaptive filter bank helps minimize estimation error that can occur when characterizing the heat transfer. In one embodiment, the adaptive filter bank may consume an incident signal that characterizes heat transfer properties associated with a volume of the thermal system, produce a reference signal which estimates an observed primary signal, calculate an estimation error, and adapt thermal coefficients to minimize estimation error.

An incident signal includes observed data and weather estimates related to active, passive, solar irradiance and unobserved heat transfer in one or more volumes of the thermal system. A thermal coefficient vector is a representation of the heat transfer characteristics associated with a specific volume of a thermal system, including passive, active, solar irradiance, and unobserved heat transfer. A thermal coefficient vector may be initialized to represent typical or expected heat transfer characteristics of a volume and adapted to improve reference signal estimation. A reference signal represents an estimated rate of temperature change associated with a volume of a thermal system and is generated from a difference equation based on an incident signal, a thermal coefficient vector, and the state of an adaptive filter bank. A primary signal represents an observed rate of temperature change in a volume of a thermal system, which may be calculated from temperatures received from a thermal control unit that is monitoring temperatures and other relevant data associated with a volume.

An estimation error is calculated based on the difference between the primary signal and the reference signal and represents an estimation error associated with using a reference signal from an adaptive filter bank at a specific state to estimate a primary signal. A thermal coefficient vector is adapted based on estimation error, in order to minimize subsequent estimation error according to a specified metric. Over a sequence of adaptations, thermal model coefficients converge to represent the heat transfer characteristics of a volume of a thermal system. Adaptation may be continuous, as convergence may be stationary, quasi-stationary, or dynamic, according to the operating condition of the thermal system, and estimation error is generally improved with increased diversity in incident signal observations.

An example application of the adaptive filter bank may be used for diagnostics that provides information related to the condition of a thermal system. The diagnostics may be based on an analysis of heat transfer characteristics of a dynamic representation of the thermal system. In that regard, the diagnostic events may indicate detection of a change in observed or estimated characteristics of the thermal system which may be related to defective or anomalous operation. In some embodiments, the diagnostic events may be generated due to evaluation of observations and estimates, over various time intervals which support classification as, for example, transient or persistent. For example, a transient diagnostic event detection may include pump, valve, or relay failures, in hydronic heating systems, or relay failure or rapid refrigerant leaks in air-based furnace, heat pump, or air conditioning systems. In other examples, a persistent diagnostic event detection includes slow boiler, pipe, or radiator water leaks, or sludge accumulation due to oxidization, in hydronic systems, or slow refrigerant leaks, damaged heat exchangers, or contaminated ducts and filters in air-based systems. In some examples, the transient diagnostic event may demonstrate either cyclic or quasi-periodic or persistent behavior, which may be caused by conditions including a slow water leak in a hydronic system, as an occupant may either be aware of the defect and elect to occasionally replace water and restore normal operations or allow the defect to evolve into persistent and increasingly anomalous operation.

To implement the diagnostics for a thermal system, a thermal model is constructed, initialized, and adapted (e.g., using the adaptive filter bank) on a per zone basis to produce a dynamic estimate of thermal coefficient data. This thermal coefficient data is used to describe and estimate the behavior of that thermal system. Then, a filter is applied to the thermal coefficient data based on a sampling rate. For example, a sampling rate may be adapted and electively combined with filter operations to reduce aliasing and implement rate adaptation, thereby converting the thermal coefficient data to an effective sample period. In response to applying the filter, one or more estimate thermal coefficient thresholds are generated. Thereupon, it is determined that a diagnostic event associated with the thermal system is detected based on whether the thermal coefficient data satisfies a corresponding estimated thermal coefficient threshold. In such case, an alert or warning message is generated indicated that some component of the thermal system may be malfunctioning or experiencing an anomalous operation due to abnormal conditions.

System Architecture

FIG. 1 is a block diagram illustrating a system architecture 100 associated with a thermal system according to an embodiment of the disclosure. A thermal system (also referred to as a site 101) may be described as a collection of interdependent volumes whose thermal behavior is described by the transfer of mass, work, and heat across the volume boundaries. Each volume is defined as a zone 103 that includes a contiguous region of uniform thermal control. In some embodiments, the system architecture 100 may implement a system for comfort-based management of the thermal system, including residential and commercial buildings with active cooling and/or heating is described, with an emphasis on practical applications.

In some embodiments, the comfort-based management associated with system architecture 100 adaptively and continuously learns the heat transfer characteristics of a thermal system, and the thermal comfort characteristics of the occupants, to facilitate optimal temperature control which minimizes power consumption while maintaining thermal comfort. Although embodiments of the disclosure are described in accordance with a certain type of system, this should not be considered as limiting the scope or usefulness of the features of the disclosure. For example, the features and techniques described herein can be used with other types systems, system architectures, local embedded controllers and/or distributed cloud computing environment.

As shown in FIG. 1, an illustrative example of the system architecture 100 is implemented in a distributed cloud-computing environment 105. The distributed cloud-computing environment 105 supports scalable distributed computing and storage in which one or more remote computing nodes 107 and relatively simple distributed devices that may include, for example, one or more thermal control units 102 which interact with one or more Heating Ventilation Air Conditioning (HVAC) units 104. The one or more remote computing nodes 107 may execute software and/or other processes. Each computing node 107 may refer to a virtual server, for example, of a physical machine, a memory partition, or any other type of computing environment and provide a full or partially isolated execution environment for the execution of an application.

Cloud computing environment 105 may achieve scalability through flexible resource allocation, often virtualizing servers 130 and computing nodes 107 which are abstracted from the physical hardware on which they reside. For example, resources can be dynamically allocated and disposed on demand, abstracting infrastructure complexity from computing nodes 107. In some embodiments, the computing nodes 107 are virtual machines that are hosted on a physical machine. The computing nodes 107 interact with distributed devices, such as thermal control unit 102 and HVAC units 104, via a network 106, to facilitate data transport, archival, and synchronization, and manage computational and storage resources, dynamically allocating and disposing of other services and jobs to support system architecture 100. In some embodiments, the network 106 may be a private network (e.g., a local area network (LAN), Wi-Fi, Bluetooth, Radio Frequency), a wide area network (WAN), intranet, etc.), or a public network (e.g., the Internet), etc.

Server 109 manages computational and storage resource allocation and disposal, facilitates data transport and synchronization, and interacts with one or more weather services 110, one or more sites 101, and one or more computing nodes 107. Computing node 107 is a collection of entities which implement the analysis and control capabilities and interacts with server 100 to execute comfort based thermal management of the one or more sites 101. A site 101 contains one or more zones 103. Each zone 103 contains one or more thermal control units 102, which interact with a server 109 and one or more HVAC units 104. For each supported site 101, a computing node 107 includes a comfort agent 120, a comfort model 130 for each zone 103, a thermal model 140 for each zone 103, one or more thermal devices 150 for each zone 103, a weather model 160.

Weather Model

Weather model 160 interacts with server 100 to exchange information with weather service 110. In some embodiments, the weather model 140 is a representation of the weather service 110 that defines forecast estimations of properties of weather conditions. These weather conditions may be relevant in a specific region of interest that includes the surrounding environment of site 101. For example, a weather estimation provided by the weather service 110 can indicate a cloud cover, humidity, solar irradiance, and/or temperature of one or more areas. The weather model 160 may estimate future conditions indirectly from the weather service 110, which provides properties at a default resolution (e.g., nominally one (1) hour) over a weather duration (e.g., nominally twenty-four (24) hours), and a finite geographical range of support that includes a site 101, location, city, region and/or the like. In some embodiments, the weather model 160 can have a unique association with a specific region of interest and the weather service 110 properties can require spatial or temporal interpolation to achieve a specified effective resolution or improve accuracy.

Thermal Device

Thermal device 150 interacts with server 109 to exchange information with a thermal control unit 102 in a zone 103. In some embodiments, a thermal device 150 may be represented as a specific thermal control unit which observes and controls the temperature of a volume (e.g., zone 103) of a thermal system (e.g., site 101). For example, the thermal control unit 102 can support active cooling and/or heating associated with the volume. For example, active cooling employs a cooling type HVAC unit 104, e.g., including an air conditioner, refrigerator, or freezer, to cool a zone 103, while active heating employs a heating type HVAC unit 104, e.g., including a furnace, heat pump, resistive heating, or electric or hydronic radiant heating, to heat a zone 103. An HVAC unit 104 can comprise any device capable of controlling temperature, by producing, consuming, or transferring heat, in a zone 103. In this regard, active cooling and heating are mutually exclusive at a specific time. In some embodiments, the thermal control unit 102 can support occupant interactions, which indicate a preference to lower or raise the temperature associated with the zones 103 of site 101. The thermal device 150 can provide an immediate and transient response to increase the thermal comfort of an occupant in response to occupant interactions, by lowering or raising the temperature by a temperature offset over a finite duration.

Comfort Agent

Comfort agent 120 interacts with server 100, and observes one or more comfort models 130, and one or more thermal models 140 associated with a site 101. The comfort agent 120 interacts with comfort models 130 to establish constraints on temperature controls, and with thermal models 140 to define a collection of physically realizable states and associated energy or power transitions. This allows the comfort agent 120 to facilitate optimal temperature control in each zone 103 in of site 101, which minimizes power consumption while maintaining thermal comfort. The optimal temperature controls facilitate an optimal start and optimal stop settings for the thermal devices 150, which dynamically advance control temperature transitions associated with active cooling or heating to compensate for heat transfer latency. This ensures that the advance control temperature transitions continue to respect defined constraints, which are physically realizable relative to anticipated environmental conditions, and opportunistically reduce power consumption.

The comfort agent 120 interacts with the comfort models 130 to establish temperature constraints which bound temperature control, and with thermal models 140 to define a collection of physically realizable states and associated energy or power transitions, to facilitate optimal temperature control in each zone 103 in site 101, which minimizes power consumption while maintaining thermal comfort. In some embodiments, the comfort agent 120 defines a cost function in terms of energy, power, currency, resource availability, or time, associated with optimal paths 125 formed by constrained state transitions over a control duration. The comfort agent 120 uses the thermal models 140 in conjunction with the comfort models 130 to select the optimal path with represents a series of state transitions that minimize cost in the context of anticipated utility and environmental conditions. Specific methods employed by the comfort agent 120 to select an optimal path may be consistent with an application of reinforcement machine learning.

An optimal path 125 is selected by the comfort agent 120, as a sequential collection of states, with an epoch of a root state a terminus of a state at a terminus of a control duration, N, where an action value vector, $\bar{q}_{u,v,c,n}$, from state index u to state index v, in cool state c, at sample n, is selected to correspond to a specific transition selected to assign a state value vector, $\bar{s}_{u,c,n}$, in estimation. As such, the optimal path 125 is the sequence of states which when traversed minimizes a root state value vector, $\bar{s}_{u,c,n}$. In some embodiments, the optimal path includes optimal start and optimal stop settings for the thermal devices 150. Optimal start advances a control temperature transition to a higher energy state to ensure that a device temperature, $T_{i,n}$, in zone 103 i, at sample n, observed at a specified control temperature transition is within a control offset, $T_C$, of an effective temperature, $T_{E,i,j,c,n}$, in cool state c. Optimal stop advances a control temperature transition to a lower energy state to ensure that a device temperature, Ti,n, in zone 103 i, at sample n, observed at a specified control temperature transition is within a control offset, $T_C$, of an effective temperature, $T_{E,i,j,c,n}$, in cool state c. Optimal start and optimal stop are integral behaviors expressed in an optimal path 125 extracted from a collection of states which defines more than one path. However, optimal start and optimal stop behaviors are elective and separable in a simple sequential solution.

Comfort Model

Comfort model 130 is a representation of the thermal comfort in a zone 103. The comfort model 400 can estimate an effective temperature at which an occupant is unlikely to object, for example thereby maintaining occupant comfort, while minimizing energy consumption due to active cooling and/or heating. An effective temperature represents the temperature associated with the lowest thermal device power consumption at which the occupants are unlikely to object. An estimation of effective temperature facilitates applications including optimal temperature control, demand response, and virtual power plant capabilities. Thermal comfort, in many aspects, may be a subjective property that may not be agreed upon by the occupants in zone 103, and the estimation of effective temperatures at which all occupants would consistently express similar satisfaction is perhaps not an entirely reasonable expectation.

The comfort model 130 addresses the issue of defining thermal comfort by constructing and adapting a collection of temperature profiles 137. The temperature profiles 137 are used to learn patterns of behavior by interactions with occupants, and by adapting temperature profiles 137 to opportunistically minimize power consumption due to active cooling or active heating at the site 103 while also characterizing thermal comfort. The comfort model 130 requires no commissioning information, does not utilize occupancy estimation, and extracts information required to characterize thermal comfort entirely from passive observation of data and events provided by associated thermal devices 150. For example, the comfort model 130 can learn multiple independent temperature profiles 137 through observation of the temperature (e.g., of a zone 103), and through occupant interactions, which indicate a preference to lower or raise the temperature. A control state is associated with a comfort model 130, to allow or prevent modification of associated temperature profiles 137, to allow the comfort based thermal management system to continue to observe and learn from temperature and power consumption patterns, even when the occupants have elected to disable optimal temperature control. If a control state associated with a comfort model 130 prevents modification of associated temperature profiles 137 related to learned behavior, alternative temperature profiles which reflect a schedule of temperature transitions specified by the occupants are employed. An independent temperature profiles 137 associated with each day of the week may be defined by the occupants and retained, without modification, until it is electively replaced. Static temperature profiles 137 also form a suitable basis for application of optimal start and optimal stop behaviors.

Thermal Model

Thermal model 140 is a representation of the thermal behavior of a volume in a thermal system, which characterizes heat transfer data 145, and estimates energy consumption and temperature in a thermal system. For example, the thermal system may be represented by site 101 and can be generalized as a collection of interdependent volumes defined as zone 103 with boundaries and a surrounding environment, whose behavior is described by the transfer of mass, work, and heat across the boundaries. In some embodiments, the thermal systems supported by the thermal model 140 as described may reasonably apply assumptions of open mechanically isolated operation and simple transient conduction when determining the heat transfer data 142. It should be noted that open mechanically isolated thermal systems do not support deformation in volumes, and associated work transfer, or mass transfer across a boundary. A thermal system, such as site 101, may be conveniently described as open and mechanically isolated, if it does not support deformation, and/or if the mass within a volume is quasi-stationary, or changes slowly relative to the rate of heat transfer. In such as case, the thermal model 140 can employ simple transient conduction to simplify analysis by neglecting temperature and pressure gradients within a volume (e.g., zone 103) by assuming that heat is conducted within the volume much faster than heat transfer across a boundary.

Heat Transfer

With respect to the heat transfer data 142 characterized by the thermal model 140, heat transfer, $$\frac{d}{dt}(Q_{i,c,t}),$$

to zone 103 i, at time t, is a measure of the aggregate rate of thermal energy change from various sources, including passive heat transfer, $$\frac{d}{dt}(Q_{Pi,t}),$$

active heat transfer, $$\frac{d}{dt}(Q_{Ai,c,t}),$$

solar heat transfer, $$\frac{d}{dt}(Q_{Si,t}),$$

and unobserved heat transfer, $$\frac{d}{dt}(Q_{Ui,t}),$$

which is represented by the following equation:

$$\frac{d}{dt}(Q_{i,c,t}) = \frac{d}{dt}(Q_{Pi,t}) + \frac{d}{dt}(Q_{Ai,c,t}) + \frac{d}{dt}(Q_{Si,t}) + \frac{d}{dt}(Q_{Ui,t})$$

Passive heat transfer, $$\frac{d}{dt}(Q_{Pi,t}),$$

to zone 103 i, at time t, is equal to the product of thermal transmittance, $h_{Pi,j}$, a property related to the heat transfer characteristics of the boundary material, the surface area of the shared zone boundary, $A_{Pi,j}$, and the difference between the temperature in zone j, $T_{j,t}$, and the temperature in zone j, $T_{i,t}$, in a site with J-1 zones, which is represented by the following equation:

$$\frac{d}{dt}(Q_{Pi,t}) = \sum_{\substack{j=0 \\ j \neq i}}^{J} \frac{d}{dt}(Q_{Pi,j,t}) = \sum_{\substack{j=0 \\ j \neq i}}^{J} h_{Pi,j} A_{Pi,j}(T_{j,t} - T_{i,t})$$

With reference to the above, the passive heat transfer relative to the surrounding environment follows Newton's Law of Cooling in a manner similar to inter-zone passive heat transfer, and thus may be modeled as a separate zone, for notational convenience. In embodiments, the passive heat transfer, to a zone 103 i across a boundary from an adjacent zone j, is extended by superposition to aggregate the passive heat transfer from each zone j which may share a boundary with zone 103 i, though the relative geometry and connectivity of the zones with a site is unknown. Inter-zone passive heat transfer may be electively neglected between zone j and zone i, if the temperatures in the zones are observed to be sufficiently similar, as the resulting temperature differences may be relatively insignificant and insufficiently diverse, resulting in a solution which is ill-conditioned.

Active heat transfer, $$\frac{d}{dt}(Q_{Ai,c,t}),$$

to zone 103 i, in cool state c, at time t, is equal to the aggregate product of thermal efficiency, $\eta_{i,c,k}$, defined as the ratio of power produced or transported, and power, $P_{i,c,k,t}$, consumed in unit index k, of K units, which is represented by the following equation:

$$\frac{d}{dt}(Q_{Ai,c,t}) = \sum_{k=0}^{K-1} \frac{d}{dt}(Q_{Ai,c,k,t}) = \sum_{k=0}^{K-1} \eta_{i,c,k} P_{i,c,k,t}$$

With reference to the above equation, substantially uniform thermal efficiency, $\eta_{i,c,k}$, relative to power consumption or transient environmental conditions, including the temperature difference between the surrounding environment and zone 103 i, may be employed as a simplifying assumption if the thermal efficiency of unit index k is relatively constant over the observed operating conditions. Multi-modal HVAC units, including heat pumps, may exhibit non-uniform thermal efficiency relative to power consumption, often demonstrating discontinuous or non-linear thermal efficiency over the observed operating conditions. In such environments, the thermal model as described, indirectly forms an aggregate estimate of thermal efficiency, extracted from specific observations.

A power estimate, $P_{i,c,k,t}$, in zone 103 i, in cool state c, in unit index k, at time t, presents a dilemma, as one or more units may demonstrate similar thermal efficiency, $\eta_{i,c,k}$. A simplifying assumption may define that power is consumed in one or more units which are aggregated into a primary unit, and that remaining units are aggregated into one or more auxiliary unit representations, due to similar anticipated efficiency. Alternatively, units may be prioritized, by relative efficiency or available capacity, and electively utilized to realize alternative temperature control scenarios, while minimizing power consumption.

In some environments, power may not be directly observable or measurable, as a metered average of power consumed over a sample period, $T_S$. In such systems, power can be abstracted to a normalized representation which defines a duty cycle, indirectly estimated from relay states. Independent of the source or units, power should generally be normalized by the maximum available power to improve the numerical accuracy of the solution.

The cool state c, which indicates if active cooling or active heating is enabled, implies independent estimation for thermal efficiency, $\eta_{i,c,k}$, in unit index k, as active cooling and active heating may be performed by physically different units. Even if the identical HVAC units are utilized to perform both active cooling and active heating, it is unreasonable to assume that these functions are performed with similar efficiency. Therefore, solutions must be independently formed and associated with a specific cooling state c, derived from observations exclusively constrained to either active cooling or active heating operation.

Solar heat transfer, $$\frac{d}{dt}(Q_{Si,t}),$$

to zone 103 i, from surface s, at time t, is equal to the aggregate product of thermal transmittance of surface s, $h_{Si,s}$, a property related to the heat transfer characteristics of the surface material, the surface area of the shared boundary exposed to incident solar radiation, $A_{Si,s}$, the complement of cloud cover, $c_{i,t}$, defined as the normalized ratio of solar irradiance obscured by clouds and available solar irradiance, $I_{i,s,t}$, which is represented by the following equation:

$$\frac{d}{dt}(Q_{Si,t}) = \sum_{s=0}^{S-1}(Q_{Si,s,t}) = \sum_{s=0}^{S-1} h_{Si,s} A_{Si,s}(1-c_{i,t})I_{i,s,t} \approx h_{Si} A_{Si} I_{i,t}$$

As the relative geometry of zones within a site is unknown, and the geometry and heat transfer characteristics of specific surfaces forming the boundary to a zone i, is also unknown, it is impractical to directly calculate the solar heat transfer for each surface s. The simplifying assumptions of stationary geometry and boundary materials in zone i, and uniform cloud cover and incident solar irradiance relative to the zone, are useful and generally sufficient to simplify the solution. Solar irradiance incident upon and normal to a single aggregate surface, at the location of the site, and accounting for losses due to cloud cover, may be readily provided by a weather service, further simplifying the solution.

Unobserved heat transfer, $$\frac{d}{dt}(Q_{Ui,t})$$

to zone 103 i, at time t, is equal to the unobserved heat, $q_{i,t}$, which represents heat produced or transported by unknown, unmeasured, or unobservable sources, including fireplaces, ovens, stoves, lighting, non-instrumented HVAC units 104, or people, which is represented by the following equation:

$$\frac{d}{dt}(Q_{Ui,t}) = q_{i,t} \approx q_i$$

Unobserved heat transfer, $$\frac{d}{dt}(Q_{Ui,t}),$$

to zone 103 i may reasonably neglected if the unobserved heat is known or determined to be negligible. Further, the simplifying assumption that the unobserved heat, $q_i$, changes slowly with respect to time relative to the memory depth, N, of the solution, and may be considered quasi-stationary, is potentially useful or necessary to form a well-conditioned solution.

Heat transfer, $$\frac{d}{dt}(Q_{i,c,t}),$$

to zone 103 i, in cool state c, at time t, is generally not directly observable. The transformation from a continuous differential equation to an equivalent causal discrete-time difference equation representation, and the substitution for heat transfer, $$\frac{d}{dt}(Q_{i,c,n}),$$

equal to the product of thermal mass, $C_i$, and rate of temperature change, $$\frac{d}{dt}(T_{i,n}),$$

in zone i, at sample n, define a practical and useful relationship, which is represented by the following equation:

$$\frac{d}{dt}(T_{i,n}) = \left[\frac{1}{C_i}\right]\frac{d}{dn}(Q_{i,c,n}) =$$
$$\sum_{\substack{j=0 \\ j \neq i}}^{J} \frac{h_{Pi,j} A_{Pi,j}}{C_i}(T_{j,n-1} - T_{i,n-1}) + \sum_{k=0}^{K-1} \frac{\eta_{i,c,k}}{C_i} P_{i,c,k,n} + \frac{h_{Si} A_{Si}}{C_i} I_{i,n=1} + \frac{q_i}{C_i}$$

It is not necessary to explicitly determine several thermal system properties related to the rate of temperature change, $$\frac{d}{dt}(T_{i,n}),$$

including passive thermal transmittance, $h_{Pi,j}$, the surface area of the shared zone boundary, $A_{Pi,j}$, thermal efficiency, $\eta_{i,c,k}$, solar thermal transmittance, $h_{Si}$, j, the surface area of the shared boundary exposed to incident solar radiation, $A_{Si,s}$, and thermal mass, $C_i$. Specific parameterized solutions, while potentially interesting in a diagnostics context, are not necessary or useful to characterize heat transfer and exploit the observed relationship between environmental conditions, including temperature, and power consumption.

A thermal coefficient vector, $\overline{w}_{i,c,n}$, in zone 103 i, in cool state c, at sample n, abstracts system dependent characteristics from the above equation, for notional convenience may be represented by the following equation:

$$\overline{\omega}_{i,c,n} = \begin{cases} \dfrac{h_{Pi,j} A_{Pi,j}}{C_i} & j:[0, J-1] \\ \dfrac{\eta_{i,c,k,n}}{C_i} & k:[0, K-1] \\ \dfrac{h_{Si} A_{Si}}{C_i} \\ \dfrac{q_i}{C_i} \end{cases}$$

In some embodiments, the thermal coefficient vector, $\overline{w}_{i,c,n}$, in zone 103 i, in cool state c, at sample n, includes thermal coefficients related to passive heat transfer, indexed by zone j, of J zones which may share a boundary with zone i, active heat transfer, indexed by unit index k, of K units, solar heat transfer, and an unobserved heat transfer. The passive thermal coefficients represent heat transfer from zone j to zone i, eliminating the condition j=i, and including the surrounding environment. Active thermal coefficients must be independently evaluated in the context of active cooling or active heating, which generally necessitates independent evaluations of the thermal coefficient vector, $\overline{w}_{i,c,n}$.

An incident vector, $\overline{x}_{i,c,n}$, in zone i, in cool state c, at sample n, in terms of temperature, $T_{j,n-1}$, in zone j, at sample n−1, temperature, $T_{i,n-1}$, in zone 103 i, power in unit index k, $P_{i,c,k,n}$, and solar irradiance, $I_{n-1}$, may be represented by the following equation:

$$x_{i,c,n}^T = \begin{cases} (T_{j,n-1} - T_{i,n-1}) & j:[0, J-1] \\ P_{i,c,k,n} & k:[0, K-1] \\ I_{i,n-1} \\ 1 \end{cases}$$

With reference to the above equation, it is often useful to filter the power, $P_{i,c,k,n}$, in zone 103 i, in cool state c, in unit index k, at sample n, by applying an appropriate low pass filter. A representative power filter is a Butterworth IIR filter, of order 2, with a −3 dB normalized frequency equal to 0.2250790799, which has a nominal group delay of 2.0 samples. It is often convenient to normalize an incident vector, $\overline{x}_{i,c,n}$, in zone i, in cool state c, at sample n, by scaling the constituents to ensure that a common range is approximated, abstracting various units of measure. This technique may be useful for improving numerical accuracy of the solution, and to indirectly scale and normalize a thermal coefficient vector, $\overline{w}_{i,c,n}$, extracted in a solution. Representative normalization scales temperature difference by 10° C., power by 1 kW, unless power is already normalized to a unity range based on relay state, and solar irradiance by 1 kW/m2, though alternative embodiments are viable and may be preferred.

A primary signal, $y_{i,c,n}$, in zone 103 i, in cool state c, at sample n, is defined as the product of a sample period, $T_S$, and an observed rate of temperature change, $$\frac{d}{dt}(T_{i,n}),$$

which may be calculated in various forms, including the first, second, and fourth order discrete derivatives defined, in terms of temperature, $T_{i,n}$, previous temperature, $T_{i,n-m}$, where m is in [1, 4], and is equal to the product of a thermal coefficient vector, $\overline{w}_{i,c,n}$, and an incident vector, $\overline{x}_{i,c,n}$, may be represented by the following equation:

$$y_{i,c,n} = T_S \frac{d}{dn}(T_{i,n}) \approx T_{i,n} - T_{i,n-1} \approx \frac{T_{i,n} - T_{i,n-2}}{2} \approx \frac{-T_{i,n} + 8T_{i,n-1} - 8T_{i,n-3} + T_{i,n-4}}{12} = \overline{x}_{i,c,n} \overline{\omega}_{i,c,n}$$

The selection of discrete derivative order is significant, as phase bias and latency compensation must be considered, and higher order discrete derivative approximations may not be sufficiently compact relative to the rate of temperature change, $$\frac{d}{dt}(T_{i,n}),$$

in zone 103 i, at sample n, and a sample period, $T_S$. Derivative representations are inherently noisy, as the process of differentiation effectively amplifies high frequency noise content in the signal related to errors and uncertainty in observations. It is useful to filter a primary signal, $y_{i,c,n}$, in zone 103 i, in cool state c, at sample n, by applying an appropriate low pass filter. A representative primary signal filter is a Butterworth IIR filter, of order 2, with a −3 dB normalized frequency equal to 0.2250790799, which has a nominal group delay of 2.0 samples. The latency of each filter must be accounted for through application of latency compensation, which effectively temporally aligns constituents of a difference equation by inserting filters or delays in appropriate signal paths, such that temporal alignment error related to asymmetric processing of specific signal paths will be minimized, and a difference equation will be faithfully implemented. Latency compensation may take many forms, either introducing delay to incident vector, $\overline{x}_{i,c,n}$, or primary signal, $y_{i,c,n}$, associated with zone 103 i, in cool state c, at sample n, such that each path has equivalent aggregate delay.

In some embodiments, the thermal coefficient vector, $\overline{w}_{i,c,n}$, may be extracted from, and independently expressed in various forms, with solutions including generalized linear inverse, or an adaptive filter bank. There are advantages associated with each solution, and an appropriate selection is application dependent. Generalized linear inverse and adaptive filter bank solutions are described, though alternative embodiments are viable and may be desired.

Generalized Linear Inverse

Generalized linear inverse, in some situations, is a statistical solution that can be applied to extract an estimate of a thermal coefficient vector, $\overline{w}_{i,c,n}$, in zone i, in cool state c, at sample n, which minimizes the aggregate estimation error of a primary signal, $y_{i,c,n}$, over a memory depth, N, corresponding to a set of independent observations. A generalized linear inverse solution may be periodic, and observations are not required to be sequentially ordered or contiguous. The solution is computationally intensive, relative to alternative methods, yet is typically performed less frequently. Storage requirements are proportional to a memory depth, N, and may be significant. Numerical accuracy is largely dependent upon the diversity of observations and a memory depth, N. Changes in a dynamic thermal system may not be discernable at a temporal resolution significantly less than a memory depth, N.

With respect to the generalized linear inverse solution, a primary vector, $\bar{y}_{i,c,n}$, in zone 103 i, in cool state c, at sample n, is equal to the product of an incident matrix, $\bar{X}_{i,c,n}$, and a thermal coefficient vector, $\bar{w}_{i,c,n}$. The primary vector, $\bar{y}_{i,c,n}$, and incident matrix, $\bar{X}_{i,c,n}$, have dimensions [N,1] and [N, J+K+2], respectively, in agreement with a thermal coefficient vector, $\bar{w}_{i,c,n}$, of dimension [J+K+2,1], over a memory depth, N, nominally 7 days, may be represented by the following equation:

$$\bar{y}_{i,c,n} = \bar{X}_{i,c,n} \bar{w}_{i,c,n}$$

Each row of a primary vector, $\bar{y}_{i,c,n}$, and an incident matrix, $\bar{X}_{i,c,n}$, is formed from independent incident vector, $\bar{x}_{i,c,m}$, in zone i, and primary signal, $y_{i,c,m}$, observations, where sample m is in [N−n, n], assuming synchronous and contiguous observation at a sample period, $T_S$. Order of observation over a memory depth, N, is independent, and need not be contiguous or sequential. It is advantageous to maximize the diversity of the observations, though the opportunity to do so may be constrained by a restriction to extract solutions in environments employing entirely passive observation. A solution may be formed with fewer observations, though a selection of memory depth, N, and diversity of observations largely determine the numerical accuracy of a solution.

A thermal coefficient vector, $\bar{w}_{i,c,n}$, in zone i, in cool state c, at sample n, is a solution to a system of linear equations defined by an incident matrix $\bar{X}_{i,c,n}$, and a primary vector, $\bar{y}_{i,c,n}$, which may be represented by the following equation:

$$\bar{w}_{i,c,n} = (\bar{X}_{i,c,n}{}^T \bar{X}_{i,c,n})^{-1} \bar{X}_{i,c,n}{}^T \bar{y}_{i,c,n}$$

The thermal coefficient vector, $\bar{w}_{i,c,n}$, in zone i, in cool state c, at sample n, demonstrates numerical accuracy which is closely related to the diversity or independence of observations in an incident matrix, $\bar{X}_{i,c,n}$, and a primary vector, $\bar{y}_{i,c,n}$. Diversity may be quantified by the condition number of the source matrix, $X_{i,c,n}{}^T X_{i,c,n}$, defined as the ratio of the maximum and minimum eigenvalues of the matrix. The condition number of a well-conditioned matrix approaches unity, and is infinite if the matrix is singular, and a solution is not possible. The numerical accuracy of a thermal coefficient vector, $\bar{w}_{i,c,n}$, solution is dependent upon the diversity of the observations from which it was formed, as the approximate digits of accuracy are proportional to the logarithm of the condition number. Explicit computation of the condition number prior to extracting a thermal coefficient vector, $\bar{w}_{i,c,n}$, would significantly increase the computational complexity of the solution, and may not be practical or possible in many environments. A practical and advantageous alternative method of rank reduction is defined, which dynamically tests and excludes specific columns from an incident matrix, $\bar{X}_{i,c,n}$, and corresponding thermal coefficient vector, $\bar{w}_{i,c,n}$, elements from a solution, ensuring sufficient diversity is present to form a solution with adequate numerical accuracy, when computation of a complete solution would otherwise not be possible, or useful.

Adaptive Filter Bank

In some implementations of the disclosure an filter bank 145 may be implemented, which is an iterative solution applied to extract an estimate of coefficient and state vectors to indirectly approximate a thermal coefficient vector, $\bar{w}_{i,c,n}$, in zone 103 i, in cool state c, at sample n. In turn, this minimizes the instantaneous estimation error of a reference signal, $v_{i,c,n}$, relative to an observed primary signal, $y_{i,c,n}$.

An adaptive filter bank solution is periodic, and observations are required to be sequentially ordered, though not contiguous. The solution is not computationally intensive, relative to alternative methods, yet is typically performed more frequently, on each observation. Storage requirements are minimal, and independent of the rate of convergence or the effective memory depth. Numerical accuracy is largely dependent upon the diversity of observations and the rate of adaptation, $\mu_j$. Changes in a dynamic thermal system are typically discernable at a temporal resolution which is significantly less than alternative methods, including generalized linear inverse. In some implementations, the adaptive filter bank 145 is constructed as a collection of J filters, each consuming an incident signal, $x_{i,c,j,n}$, in zone $i_j$ in cool state c, in filter index j, at sample n, and producing a reference signal, $v_{i,c,j,n}$, where the effective transfer function of each filter is iteratively adapted as a function of a representation of estimation error.

In this disclosure, the architecture of an Infinite Impulse Response (IIR) to a reference Direct II design, though alternative embodiments including Direct I, Lattice, and Parallel are discussed and may be preferred. A Finite Impulse Response (FIR) filter may be a viable alternative to an IIR filter, as it is architecturally equivalent, with the additional restriction that a recursive coefficient vector, $\bar{a}_{i,c,j,n}$, is static and comprised of elements with a value equal to zero. Adaptive filters with dynamic coefficients are described, though it may be advantageous to initially define one or more filters in an adaptive filter bank 145 with static coefficient, based on a priori knowledge, or to transition to a static solution after achieving a specified performance.

In some embodiments, the adaptive filter 200 is one in a collection of adaptive filters that can make up an adaptive filter bank, such as adaptive filter bank 145 of FIG. 1. The system architecture 100 can implement the adaptive filter bank 145 as processing logic 143 that can include hardware (e.g., circuitry, dedicated logic, programmable logic, microcode, etc.), software, firmware, or a combination thereof. In one embodiment, the adaptive filter bank 145 can be implement as part of a service in the cloud computing environment 105 of the system for comfort-based management. For example, the service associated with the adaptive filter bank 145 can be utilized to adapt the thermal model 140 to further assist in characterizing the heat transfer associated with the comfort-based management of site 101. In other embodiments, the service associated with the adaptive filter bank 145 may be installed and utilized for comfort-based management by various other components of system architecture 100, which may or may not be geographically disbursed.

Figure 2:
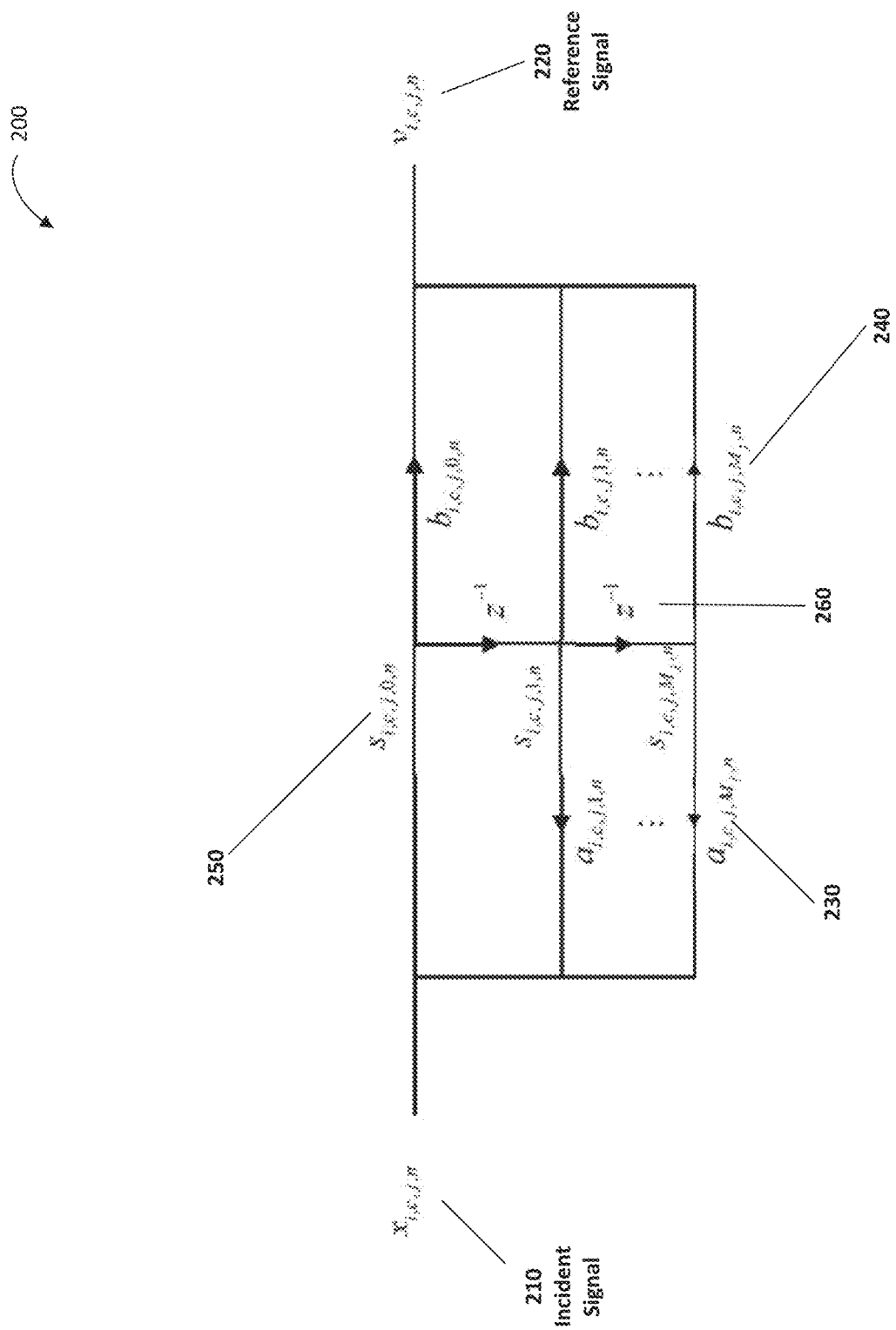
FIG. 2 is an example of an adaptive filter according to an embodiment of the disclosure.

FIG. 2 is an example of an adaptive IIR filter 200 according to an embodiment of the disclosure in Direct II form. The adaptive filter 200 implements a difference equation as a function of an incident signal 210, $x_{i,c,j,n}$, in zone 103 i, in cool state c, in filter index j, at sample n, a recursive coefficient vector 230, $\bar{a}_{i,c,j,n}$, and a forward coefficient vector 240, $\bar{b}_{i,c,j,n}$, to produce a reference signal 220, $v_{i,c,j,n}$. A state vector 250, $s_{i,c,j,n}$, is implemented to retain a recursive internal filter state, and is delimited by discrete-time unit delays 260, $z^{-1}$, and an filter order, $M_j$. For example, the recursive coefficient vector 230, $\bar{a}_{i,c,j,n}$, forward coefficient vector 240, $\bar{b}_{i,c,j,n}$, and state vector 250, $s_{i,c,j,n}$, in zone 103 i, in cool state c, in filter index j, at sample n, are of dimension, $[M_j, 1]$. As a matter of notational convenience, a zero-index recursive coefficient 230, $\bar{a}_{i,c,j,0,n}$, has an implicit persistent value equal to zero, and a zero-index state coefficient, $s_{i,c,j,0,n}$, consumes no storage and is useful in the context of updating a state vector 250, $s_{i,c,j,n}$.

In some embodiments, there are stability considerations in an adaptive IIR filter 200, as poles, or roots of the denominator of a discrete transfer function derived from a z-transform of a difference equation, are constrained to the interior of a unit circle to form a stable causal solution, and zeros, or roots of the numerator of the transfer function, may be similarly constrained only if a minimum phase solution is desired. Root calculation may be computationally prohibitive in many environments, though the process is dependent on filter order, $M_j$.

In some embodiments, adaptive IIR filter 200 is initialized by assigning a stable recursive coefficient vector 230, $\bar{a}_{i,c,j,0}$, in zone 103 i, in cool state c, in filter index j, at sample n equal to zero, with values determined from an a prior solution, or small random values, and a forward coefficient vector 240, $\bar{b}_{i,c,j,0}$, with values determined from an a prior solution, or small random values.

A state coefficient 250, $s_{i,c,j,m,0}$, in zone 103 i, in cool state c, in filter index j, in coefficient index m, at sample n, is initialized as a function of an initial incident signal 210, $x_{i,c,j,0}$, a recursive coefficient vector 230, $\bar{a}_{i,c,j,0}$, and a forward coefficient vector 240, $\bar{b}_{i,c,j,0}$, by assuming persistent operation in this condition to reduce edge effects, where m is in [1, $M_j$], which is represented by the following equation:

$$s_{i,c,j,m,0} = x_{i,c,j,0} \left( \frac{(1 - b_{i,c,j,0,0})}{\sum_{m=1}^{M}(a_{i,c,j,m,0}b_{i,c,j,0,0} + b_{i,c,j,m,0})} \right) \Big|_{m:[1,M_j]}$$

The adaptive IIR filter 200 is synchronously evaluated at a sample period, $T_s$, by defining a reference signal 220, $v_{i,c,j,n}$, in zone 103 i, in cool state c, in filter index j, at sample n, and modifying a state vector 250, $\bar{s}_{i,c,j,n}$. In one embodiment, the adaptive filter 200 is electively adapted after each evaluation, by modifying a recursive coefficient vector 230, $\bar{a}_{i,c,j,n}$, and a forward coefficient vector 240, $\bar{b}_{i,c,j,n}$. In this disclosure, the process by which the coefficients of an adaptive filter are modified to Least Mean Squares (LMS) adaptation, though alternative embodiments including Normalized Least Mean Squares (NLMS), Recursive Least Squares (RLS), and other variations of gradient descent adaptation are discussed and may be preferred.

A reference signal 220, $v_{i,c,j,n}$, in zone 103 i, in cool state c, in filter index j, at sample n, is equal to the sum of the product of the transpose sum of a recursive coefficient vector 230, $\bar{a}_{i,c,j,n}$, scaled by an initial forward coefficient 240, $b_{i,c,j,0,n}$, and a forward coefficient vector 240, $\bar{b}_{i,c,j,n}$, and a state vector 250, $\bar{s}_{i,c,j,n}$, and the product of an incident signal 210, $x_{i,c,j,n}$, and an initial forward coefficient, $b_{i,c,j,0,n}$, which is represented by the following equation:

$$v_{i,c,j,n} = (\bar{a}_{i,c,j,n} b_{i,c,j,0,n} + \bar{b}_{i,c,j,n})^T \bar{s}_{i,c,j,n} + b_{i,c,j,n,0,n} x_{i,c,j,n} \big|_{s_{i,c,j,0,n}=0}$$

With reference to the above equation, the state coefficient 250, $s_{i,c,j,0,n}$, in zone 103 i, in cool state c, in filter index j, in coefficient index zero, at sample n, is the sum of the product of the transpose of a recursive coefficient vector 230, $\bar{a}_{i,c,j,n}$, and a state coefficient vector 250, $\bar{s}_{i,c,j,n}$, and an incident signal 210, $x_{i,c,j,n}$, which is represented by the following equation:

$$s_{i,c,j,0,n} = \bar{a}_{i,c,j,n}^T \bar{s}_{i,c,j,n} + x_{i,c,j,n}$$

In some embodiments, the state coefficient 250, $s_{i,c,j,m,n+1}$, in zone 103 i, in cool state c, in filter index j, in coefficient index m, at sample n+1, is assigned the value of a state coefficient, $s_{i,c,j,m,n1}$, in coefficient index m−1, at sample n, where m is in 1[1,$M_j$], which is represented by the following equation:

$$s_{i,c,j,m,n+1} = s_{i,c,j,m-1,n} \big|_{m:[1,M_j]}$$

In some embodiments, a reference signal 220, $v_{i,c,n}$, in zone 103 i, in cool state c, at sample n, is the sum of a reference signal 220, $v_{i,c,j,n}$, in filter index j, in [0, J−1], which is represented by the following equation:

$$v_{i,c,n} = \sum_{j=0}^{J-1} v_{i,c,j,n}$$

In some embodiments, the estimation error, $e_{i,c,n}$, in zone 103 i, in cool state c, at sample n, is defined as the difference of a primary signal, $y_{i,c,n}$, and a reference signal, $v_{i,c,n}$, and represents the error associated with using a reference signal from an adaptive filter bank at a specific state to estimate a primary signal, which is represented by the following equation:

$$e_{i,c,n} = y_{i,c,n} - v_{i,c,n}$$

The estimation error, $e_{i,c,n}$, in zone 103 i, in cool state c, at sample n, is the instantaneous measure of the numerical accuracy of a solution, which is a necessary if not sufficient condition to adapt a recursive coefficient vector 230, $\bar{a}_{i,c,j,n}$, and a forward coefficient vector 240, $\bar{b}_{i,c,j,n}$, in filter index j, in [0, J−1]. It may be useful to visualize an estimation error, $e_{i,c,n}$, as a contiguous differentiable surface in $M_j$ dimensions, as a function of a recursive coefficient vector 230 $\bar{a}_{i,c,j,n}$, and a forward coefficient vector 240, $\bar{b}_{i,c,j,n}$.

A recursive coefficient vector, $\bar{a}_{i,c,j,n}$, in zone 103 i, in cool state c, in filter index j, at sample n+1, is defined as the difference of a recursive coefficient vector 230, $\bar{a}_{i,c,j,n}$, at sample index n, and the product of a rate of adaptation, $\mu_j$, and the gradient estimate of a recursive coefficient, $\nabla a_{i,c,j,n}$, the partial derivative of an $L_1$ or $L_2$ representation of estimation error, $e^2_{i,c,n}$, with respect to recursive coefficients, which is represented by the following equation:

$$\bar{a}_{i,c,j,n+1} = \bar{a}_{i,c,j,n} - \mu_j(\nabla)_{a_{i,c,j,n}} = \bar{a}_{i,c,j,n} - \mu_j\left(\frac{\partial}{\partial a_{i,c,j,n}}(e^2_{i,c,n})\right)$$

In the above note equation, the rate of adaptation, $\mu_j$ is exponentially related to the rate of convergence, and proportional to misadjustment, or noise injected by the adaptive process, and must be selected appropriately to ensure a stable system with adequate convergence and numerical accuracy, relative to the thermal system.

With reference to FIG. 2, a recursive coefficient vector 230, $\bar{a}_{i,c,j,n+1}$, in zone 103 i, in cool state c, in filter index j, at sample n+1, is the sum of a recursive coefficient vector 230, $\bar{a}_{i,c,j,n}$, at sample n, and the product of a rate of adaptation, $\mu_j$, an estimation error, $e_{i,c,n}$, and the partial derivative of a reference signal 220, $v_{i,c,j,n}$, in filter index j, in [0, J−1], which is represented by the following equation:

$$\overline{a}_{i,c,j,n+1} = \overline{a}_{i,c,j,n} + \mu_j e_{i,c,n}\left(\frac{\partial}{\partial a_{i,c,j,n}}(v_{i,c,j,n})\right)$$

A state gradient vector, $\overline{q}_{i,c,j,n}$, in zone 103 i, in cool state c, in filter index j, at sample n, defined for notational convenience, is the sum of the inner product of a recursive coefficient vector 230, $\overline{a}_{i,c,j,n}$, and a state gradient vector, $\overline{q}_{i,c,j,n-m}$, and a state gradient vector, $\overline{q}_{i,c,j,n}$, at sample index n-m, where m is in [1, $M_j$], which is represented by the following equation:

$$\overline{q}_{i,c,j,n} = \left(\frac{\partial}{\partial a_{i,c,j,n}}(\overline{s}_{i,c,j,n})\right) = \overline{a}_{i,c,j,n-m} \cdot \overline{q}_{i,c,j,n-m} + \overline{s}_{i,c,j,n-m} \mid_{m:[1,M_j]}$$

With reference to the above equation, the recursive coefficient vector 230, $\overline{a}_{i,c,j,n+1}$, in zone 103 i, in cool state c, in filter index j, at sample n+1, is the sum of a recursive coefficient vector 230, $\overline{a}_{i,c,j,n}$, at sample index n, and the product of a rate of adaptation, $\mu_j$, an estimation error, $e_{i,c,n}$, and an expression of a recursive coefficient vector 230, $\overline{a}_{i,c,j,n}$, a forward coefficient vector 240, $\overline{b}_{i,c,j,n}$, and a state gradient vector, $\overline{q}_{i,c,j,n}$, which is represented by the following equation:

$$\overline{a}_{i,c,j,n+1} =$$
$$\overline{a}_{i,c,j,n} + \mu_j e_{i,c,n}(b_{i,c,j,0,n}\overline{s}_{i,c,j,n} + (\overline{a}_{i,c,j,n}b_{i,c,j,0,n} + \overline{b}_{i,c,j,n}) \cdot \overline{q}_{i,c,j,n}) \mid_{q_{i,c,j,0,n}=0}$$
$$s_{i,c,j,0,n}=0$$

In some embodiments, a forward coefficient vector 240, $\overline{b}_{i,c,j,n+1}$, in zone 130 i, in cool state c, in filter index j, at sample n+1, is defined as the difference of a forward coefficient vector 240, $\overline{b}_{i,c,j,n}$, at sample index n, and the product of a rate of adaptation, $\mu_j$, and the gradient estimate of a recursive coefficient, $\nabla_{i,c,j,n}$, the partial derivative of an $L_1$ or $L_2$ representation of estimation error, $e^2_{i,c,n}$, with respect to forward coefficients. An equivalent expression is the sum of a forward coefficient vector 240, $\overline{b}_{i,c,j,n}$, at sample n, and the product of a rate of adaptation, $\mu_j$, an estimation error, $e_{i,c,n}$, and the partial derivative of a reference signal 220, $v_{i,c,j,n}$, in filter index j, in [0, J-1], which is represented by the following equation:

$$\overline{b}_{i,c,j,n+1} = \overline{b}_{i,c,j,n} - \mu_j\left(\frac{\partial}{\partial b_{i,c,j,n}}(e^2_{i,c,n})\right) = \overline{b}_{i,c,j,n} + \mu_j e_{i,c,n}\left(\frac{\partial}{\partial b_{i,c,j,n}}(v_{i,c,j,n})\right)$$

The forward coefficient, $b_{i,c,j,0,n+1}$, in zone 103 i, in cool state c, in filter index j, in coefficient index zero, at sample n+1, is the sum of a forward coefficient, $b_{i,c,j,0,n}$, at sample n, and the product of a rate of adaptation, $\mu_j$, an estimation error, $e_{i,c,n}$, and the partial derivative of a reference signal 220, $v_{i,c,j,n}$, in filter index j, in [0, J-1], which is represented by the following equation:

$$b_{i,c,j,0,n+1} = b_{i,c,j,0,n} + \mu_j e_{i,c,n}(\overline{a}_{i,c,j,n}^T \overline{s}_{i,c,j,n} + x_{i,c,j,n})$$

In other embodiments, the forward coefficient vector 240, $\overline{b}_{i,c,j,n+1}$, in zone 103 i, in cool state c, in filter index j, at sample n+1, is defined as the sum of a forward coefficient vector 240, $\overline{b}_{i,c,j,n}$, at sample index n, and the product of a rate of adaptation, $\mu_j$, an estimation error, $e_{i,c,n}$, and a state vector, $s_{i,c,j,n}$, which is represented by the following equation:

$$\overline{b}_{i,c,j,n+1} = \overline{b}_{i,c,j,n} + \mu_j e_{i,c,n}\overline{s}_{i,c,j,n} \mid_{s_{i,c,j,0,n}=0}$$

Figure 3:
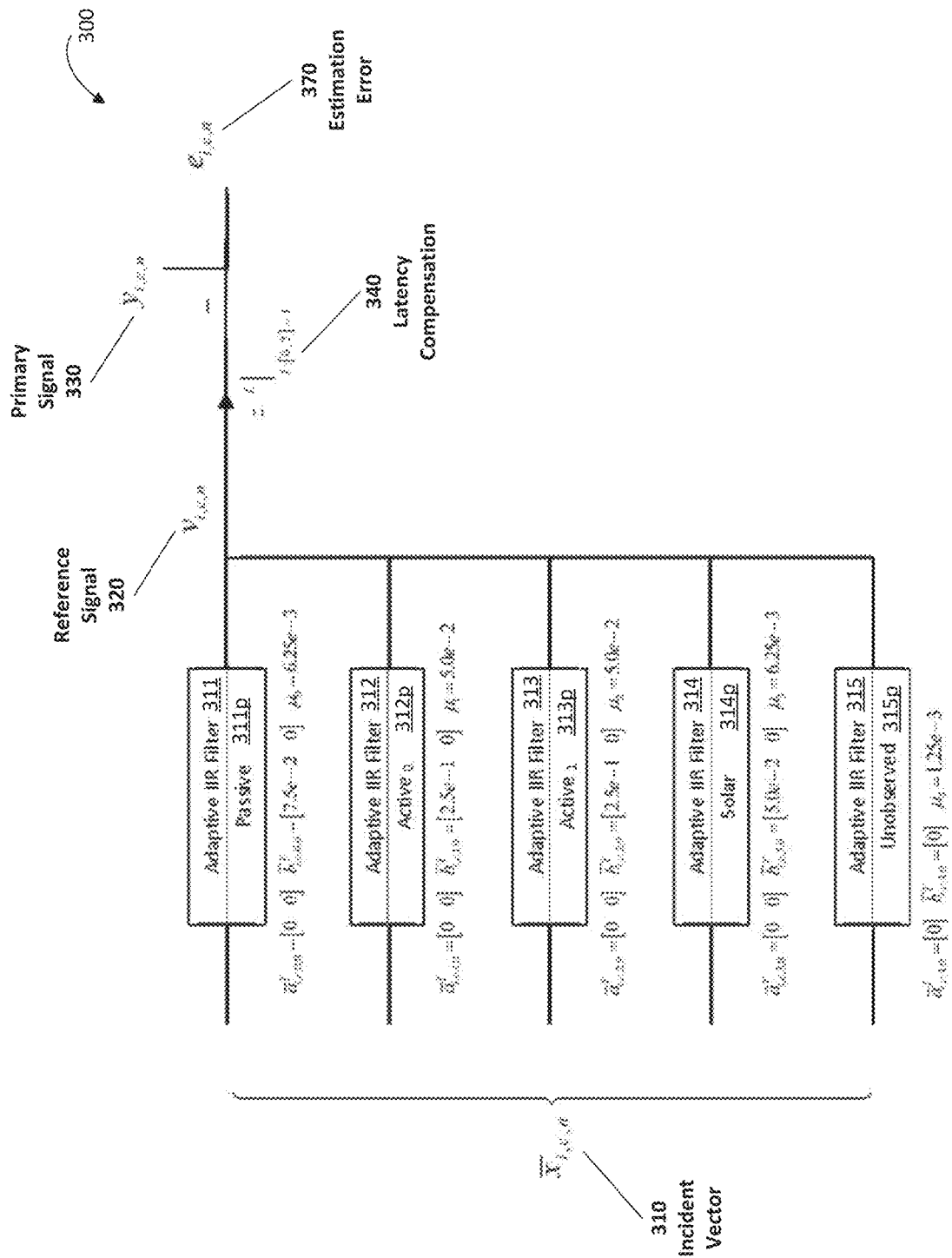
FIG. 3 is another example of an adaptive filter bank according to an embodiment of the disclosure.

Turning to FIG. 3, an example architecture of an adaptive filter bank 300 is shown. In some embodiments, the adaptive filter bank 300 may be the same as adaptive filter bank 145 of FIG. 1. The adaptive filter bank 300 may be constructed as a collection of adaptive filters 311-315, such as the adaptive IIR filter 200 of FIG. 2.

A collection of adaptive filters 311-315 are defined to process an incident vector 310, $\overline{x}_{i,c,n}$, i, n zone $i_j$, in cool state c, at sample n, with incident signals 210, $x_{i,c,j,n}$, in filter index j, related to passive active, auxiliary, solar, and unobserved heat transfer. A reference signal 320, $v_{i,c,n}$, is an aggregate estimate of a primary signal 330, $y_{i,c,n}$, after application of a suitable delay 340, $z^{-L}$, an application of latency compensation, which minimizes temporal alignment error by inserting a delay in a reference signal path of L cycles. An estimation error 370, $e_{i,c,n}$, is defined to electively adapt recursive coefficient vectors, $\overline{a}_{i,c,j,n}$, and forward coefficient vectors, $\overline{b}_{i,c,j,n}$, at various rates of adaptation, $\mu_j$.

Each adaptive filter 311-315 of the adaptive filter bank 300 consumes an incident vector 310, $\overline{x}_{i,c,n}$, in zone i, in cool state c, at sample n, with incident signals 210, $x_{i,c,j,n}$, in filter index j, to produce a reference signal 320, $v_{i,c,n}$. For example, the incident signals 210, $x_{i,c,j,n}$, may be received from the thermal model 140 and includes thermal coefficient data related to at least one of: an active, passive, solar irradiance and unobserved heat transfer in zones 103 i. In this regard, the adaptive filter bank 300 defines the thermal coefficients associated with a corresponding heat transfer property so that they can be individually evaluated and modified accordingly.

Each of the adaptive filters 311-315 of the adaptive filter bank 300 includes a respective filter portion 311p-315p that is associated with a transfer function. An effective transfer function of the filter portions 311p-315p is iteratively adapted as a function of a representation of an estimation error 370, which represents the error associated with using the reference signal 230 from the adaptive filter bank 300 at a specific state to estimate a primary signal 340, $y_{i,c,n}$. Each of the filter portions 311p-315p is defined to process the incident vector 310, $\overline{x}_{i,c,n}$, in zone i, in cool state c, at sample n, with incident signals 210, $x_{i,c,j,n}$, in filter index j, related to passive, active, auxiliary, solar, and unobserved heat transfer, to produce reference signal 320, $v_{i,c,n}$. For example, the transfer function may take a respective incident signal 210, $x_{i,c,j,n}$ as input and return as output, a recursive coefficient vector $\overline{a}_{i,c,j,n}$, a forward coefficient vector $\overline{b}_{i,c,j,n}$, and a rate of adaptation, $\mu_j$.

In some embodiments, the reference signal 320, $v_{i,c,n}$, is an aggregate of an estimate of a primary signal 330, $y_{i,c,n}$ (which is produced by each of the adaptive filters 311-315), after application of a suitable delay, $z^L$, (e.g., an application of latency compensation 340). In one illustrative example, the latency compensation 340 minimizes temporal alignment error by inserting a delay in a reference signal path of L cycles (e.g., nominally in [0, 2]. The latency of each of the adaptive filters 311-315 must be accounted for through application of latency compensation 340, which effectively temporally aligns constituents of a difference equation by inserting filters or delays in appropriate signal paths. In this way, any temporal alignment error related to asymmetric processing of specific signal paths will be minimized, and a difference equation will be faithfully implemented. Latency compensation 340 may take many forms, for example, by either introducing delay to incident vector 310, $\bar{x}_{i,c,n}$, or primary signal 330, $y_{i,c,n}$, associated with zone i, in cool state c, at sample n, such that each path has equivalent aggregate delay.

In some embodiments, the adaptive filters 311-315 of adaptive filter bank 300 may be adapted based on the estimation error 370, $e_{i,c,n}$. For example, the estimation error 370, $e_{i,c,n}$, is defined by the adaptive filter logic 132 to electively adapt recursive coefficient vectors, $\bar{a}_{i,c,j,n}$, and forward coefficient vectors, $\bar{b}_{i,c,j,n}$, at various rates of adaptation, $\mu_j$. This is accomplished, for example, by the adaptive filter logic 132 utilizing the adaptive filters 311-315 to solve a system of linear equations (as described with reference to adaptive filter 200 of FIG. 2), where each equation is formed from an independent observation of the incident signals 210 associated with the incident vector 310 and a thermal coefficient vector $\bar{w}_{i,c,n}$. In some embodiments, the adaptive filters 311-315 are adaptively updated until a solution associated with zone 103 is satisfied. For example, the solution may indicate a numerical convergence between the reference signal 320 and the primary signal 330 associated with zone 103, which helps minimize estimation error and ensures the numerical accuracy of a solution for comfort-based management of zone 103.

Figure 4:
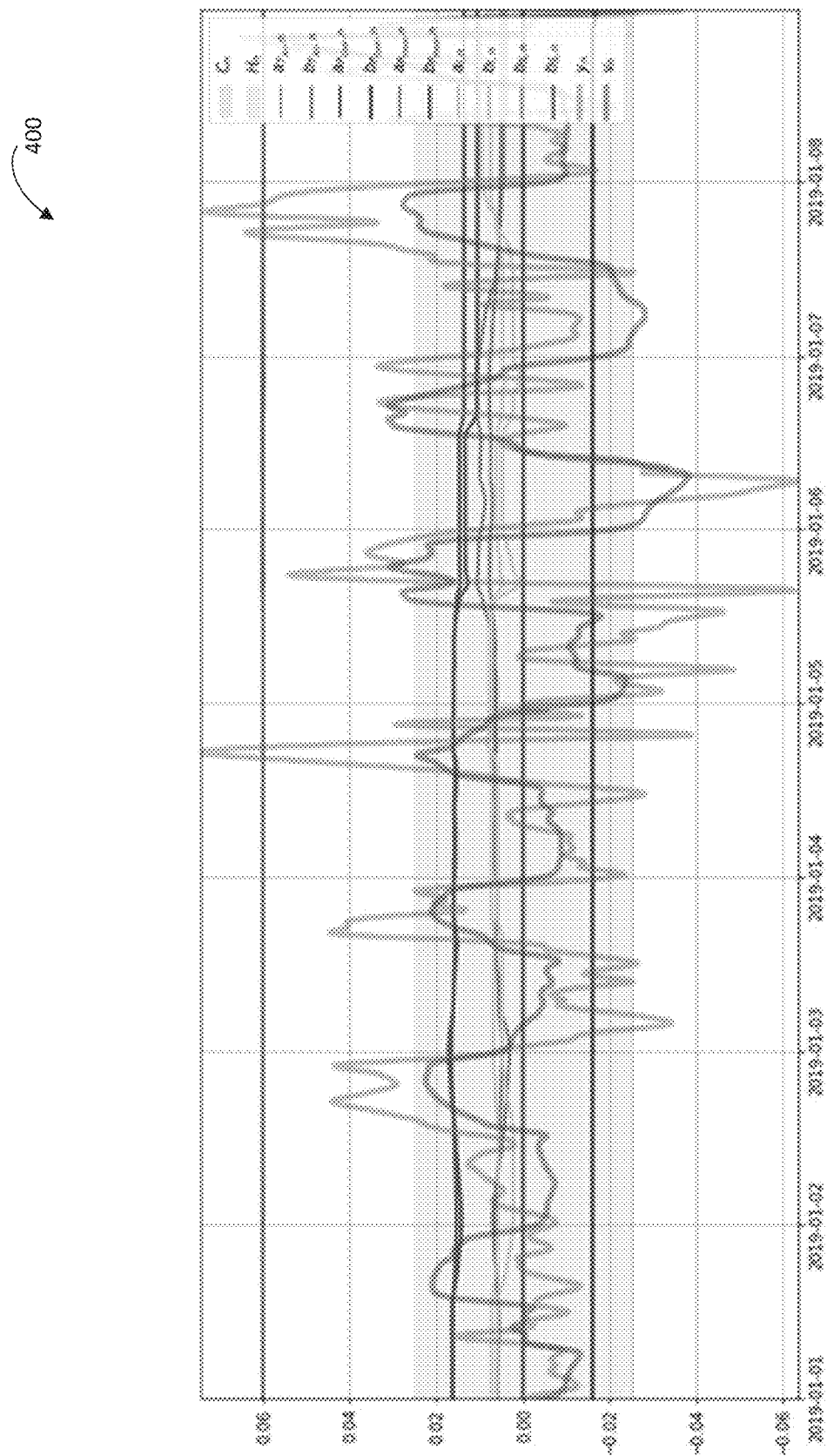
FIG. 4 is an example graph illustrating a thermal model adaptive filter solution according to an embodiment of the disclosure.

FIG. 4 is an example graph 400 representing a thermal model adaptive filter solution according to an embodiment of the disclosure. In FIG. 4, a recursive coefficient vector $\bar{a}_{i,c,n}$, in zone i, in cool state c, at sample n, a forward coefficient vector, $\bar{b}_{i,c,n}$, is illustrated in a commercial site (e.g., site 101 of FIG. 1) with twelve zones, illustrating a specific zone (e.g., zone 103) containing five HVAC units (e.g., HVAC unit 104), at UTC-5, over consecutive days of active heating. The recursive coefficient vector and forward coefficient vector are associated with a thermal model (e.g., thermal model 140), implementing an adaptive filter bank solution in which the adaptive filter bank 145 is initially reset to a nominal condition, and is iteratively adapted over an interval of contiguous operation.

In graph 400, a sequence of a reference signal, $v_{i,c,n}$, estimated from an adaptive filter bank which processes an incident vector, $\bar{x}_{i,c,n}$, and a primary signal, $y_{i,c,n}$, calculated as a discrete rate of temperature change, an inherently noisy signal, are illustrated. An estimation error, $e_{i,c,n}$, defined as the difference between the primary signal and reference signal, is employed to adapt the recursive coefficient vector and forward coefficient vector, to continuously and opportunistically improve the reference signal estimate. Forward coefficient vector components associated with passive heat transfer, active heat transfer, and solar heat transfer are observed to exhibit significant change over 2019 Jan. 5 through 2019 Jan. 7, corresponding to significant changes in air temperature and solar irradiance outside the boundary of the thermal system, and corresponding increased power consumption in the zone. An increase in incident vector diversity reduced the estimation error, and the improved accuracy of the reference signal estimation relative to the primary signal, illustrating thermal model convergence.

Estimation

In one illustrative example, the utility of a thermal model (e.g., thermal model 140), and the justification for extracting and validating a thermal coefficient vector, $\bar{w}_{i,c,n}$, is found in the estimation of temperature and power, which facilitate applications including optimal start, optimal stop, savings estimation, diagnostics, demand response, and virtual power plant capabilities. For example, a temperature estimate, $T_{i,n}$, in zone i, at sample n, is the sum of a previous temperature, $T_{i,n-1}$, at sample n-1, and a reference signal, $v_{i,c,n}$, in an adaptive filter bank solution, is represented by the following equation:

$$T_{i,n} = T_{i,n-1} + \bar{x}_{i,c,n}\bar{\omega}_{i,c,n} = T_{i,n-1} + v_{i,c,n}$$

With reference to the above equation, the temperature estimation is useful to iteratively estimate a sequence of temperatures, requiring only a previous estimated or observed temperature, $T_{i,n-1}$, a sequence of anticipated power consumption vectors, $P_{i,c,n}$, and forecast temperature and solar irradiance estimates provided by a weather model, such as weather model 160 of FIG. 1. In some embodiment, the temperature estimation may be used to project possible behavior relative to various scenarios which differ in power consumption, availability, or cost.

A power estimate, $P_{i,c,k,n}$, in zone 103 i, in cool state c, in unit index k, at sample n, is the ratio of the difference of a primary signal, $y_{i,c,n}$, and the product of an incident vector, $\bar{x}_{i,c,n}$, and a thermal coefficient vector, $\bar{w}_{i,c,n}$, and an active thermal coefficient, $\bar{w}_{i,c,m,n}$, in coefficient index m, assuming zero power consumption in associated unit k, may be represented by the following equation.

$$P_{i,c,k,n} = \left(\frac{1}{\omega_{i,c,m,n}}\right)(y_{i,c,n} - \bar{x}_{i,c,n}\bar{\omega}_{i,c,n})\bigg|_{\substack{P_{i,c,k,n}=0 \\ k\sim m}}$$

A specific solution for a power estimate, $P_{i,c,k,n}$, in zone i, in cool state c, in unit index k, at sample n, is not explicitly available without a specific definition of the adaptive filters (such as adaptive filters 311-315 of FIG. 3) used in an adaptive filter bank solution. In some embodiments, the process for defining a solution for a power estimate originates with a definition relating a reference signal, $v_{i,c,j,n}$, in filter index j, associated with unit k, to an estimation error, $e_{i,c,n}$.

The reference signal, $v_{i,c,j,n}$, in zone i, in cool state c, in filter index j, at sample n, is the difference of a primary signal, $y_{i,c,n}$, and a reference signal, $v_{i,c,n}$, or equivalently an estimation error, $e_{i,c,n}$, assuming zero power consumption in associated unit k, in an adaptive filter bank solution, which is represented by the following equation:

$$v_{i,c,j,n} = y_{i,c,n} - v_{i,c,n} = e_{i,c,n}\bigg|_{\substack{P_{i,c,k,n}=0 \\ k\sim j}}$$

When an adaptive filter bank solution is comprised of adaptive IIR filters, of filter order, $M_j$, equal to zero. A recursive coefficient vector, $\bar{a}_{i,c,j,n}$, in zone i, in cool state c, in filter index j, at sample n, is a vector of unit length with zero values. A forward coefficient vector, $\bar{b}_{i,c,j,n}$, in filter index j, is a vector of unit length with an adaptive value equal a forward coefficient, $b_{i,c,j,0,n}$, which is equivalent in representation to a thermal coefficient, $\bar{w}_{i,c,m,n}$, in coefficient index m. A power estimate, $P_{i,c,k,n}$, in this system is directly derived from the power estimation equation above. In some embodiments, the power estimation is useful to iteratively estimate a sequence of power consumption, requiring only a sequence of deterministic temperature estimates, $T_{i,n}$, and forecast temperature and solar irradiance estimates provided by a weather model. The power estimation may also be used to project possible behavior relative to alternative temperature control scenarios.

If inter-zone passive heat transfer is electively considered in a thermal system, such as site 101, estimation of temperature and power must generally be performed recursively, through interaction with other thermal models, as the passive heat transfer from each zone j which may share a boundary with zone 103 i will influence the temperature and power consumption of zone 103 i. Alternatively, in many thermal systems, it may be either reasonable or practically necessary to assume that inter-zone passive heat transfer is negligible relative to temperature and power estimation. For example, it may be necessary to neglect inter-zone passive heat transfer in thermal systems where control temperatures are similar in zones which share a boundary, as temperature differences between the zones may not be sufficiently diverse to extract an accurate solution using the techniques disclosed herein.

Example Flow Diagrams

Figure 5:
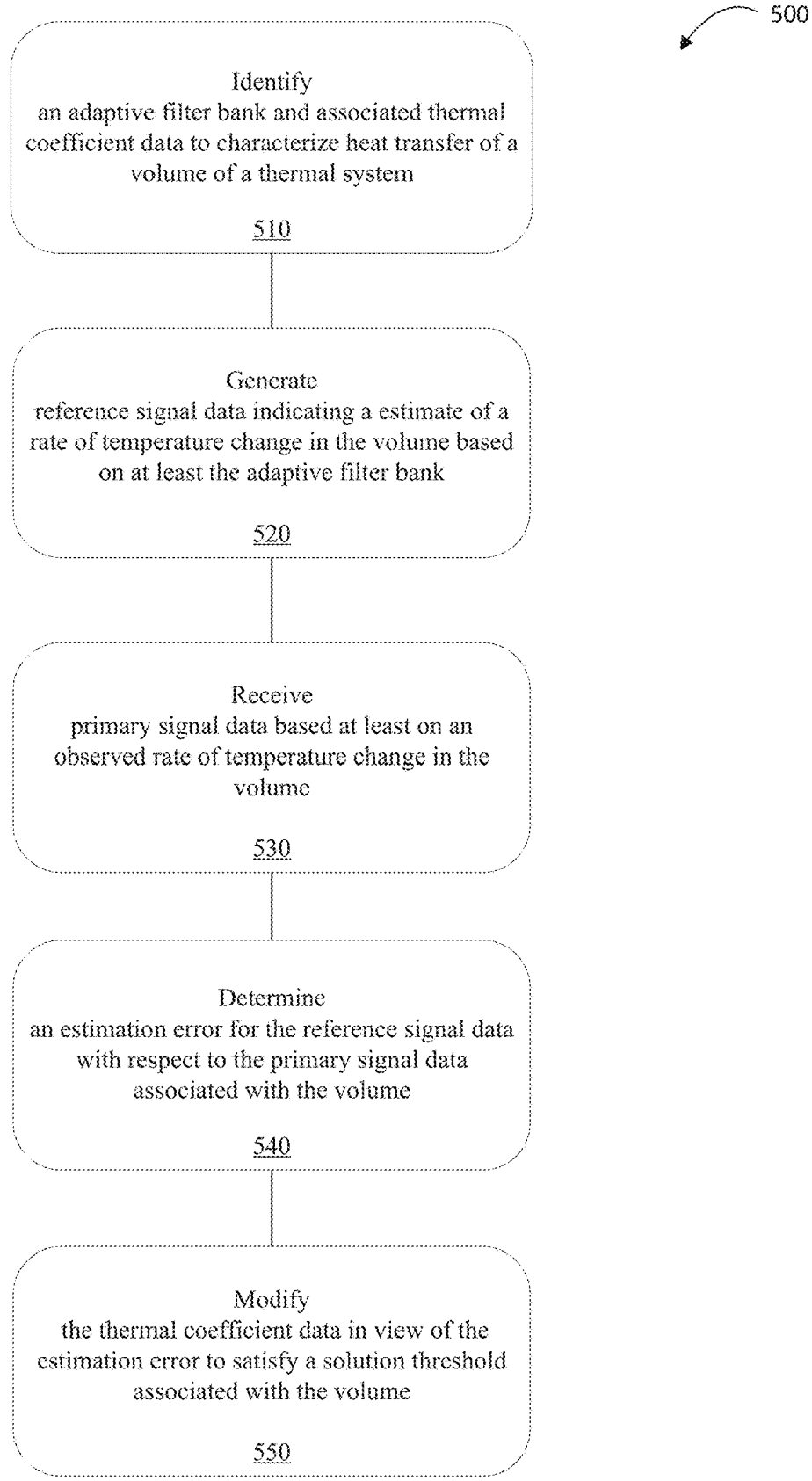
FIG. 5 is a flow diagram of a method of implementing an adaptive filter bank for modeling a thermal system according to an embodiment of the disclosure.

FIG. 5 is a flow diagram of a method 500 of implementing an adaptive filter bank for modeling a thermal system according to an embodiment of the disclosure. Method 500 may be performed by processing logic that may comprise hardware (e.g., circuitry, dedicated logic, programmable logic, microcode, etc.), software, firmware, or a combination thereof. In one embodiment, the adaptive filter logic 125 as executed by a processor of system architecture 100 may perform method 500. Although shown in a particular sequence or order, unless otherwise specified, the order of the processes can be modified. Thus, the illustrated implementations should be understood only as examples, and the illustrated processes can be performed in a different order, and some processes may be performed in parallel. Additionally, one or more processes can be omitted in various embodiments. Thus, not all processes are required in every implementation. Other process flows are possible.

Method 500 begin in block 510 where an adaptive filter bank and associated thermal coefficient data to characterize heat transfer of a volume of a thermal system are identified. For example, an adaptive filter bank to define the architecture, order, and latency of component filters and associated thermal coefficients are identified to characterize heat transfer in a volume of a thermal system. In block 520, reference signal data indicating an estimate of a rate of temperature change in the volume based on at least the adaptive filter bank is generated. In block 530, primary signal data based at least on an observed rate of temperature change in the volume is received. An estimation error for the reference signal data with respect to the primary signal data associated with the volume is determined in block 540. In view of the estimation error, the thermal coefficient data is modified in block 550 to satisfy a solution associated with the volume. For example, the thermal coefficients are modified to reduce estimation error and improve approximation of a rate of temperature change in a reference signal.

FIG. 6 is a flow diagram of another method 600 of implementing an adaptive filter for modeling a thermal system according to an embodiment of the disclosure. Method 600 may be performed by processing logic that may comprise hardware (e.g., circuitry, dedicated logic, programmable logic, microcode, etc.), software, firmware, or a combination thereof. In one embodiment, the adaptive filter logic 125 as executed by a processor of system architecture 100 may perform method 600. Although shown in a particular sequence or order, unless otherwise specified, the order of the processes can be modified. Thus, the illustrated implementations should be understood only as examples, and the illustrated processes can be performed in a different order, and some processes may be performed in parallel. Additionally, one or more processes can be omitted in various embodiments. Thus, not all processes are required in every implementation. Other process flows are possible.

Method 600 begin in block 610 where an incident signal comprising thermal coefficients associated with a volume of a thermal system is received at an adaptive filter bank. In block 620, a reference signal indicating an estimate of a rate of temperature change in the volume based on at least the adaptive filter bank is produced. An estimation error for the reference signal with respect to a primary signal associated with the volume is determined in block 630. The adaptive filter bank is updated in block 640 based on the estimation error to meet an approximation of the rate of temperature change in the volume with respect to a reference signal.

Diagnostics

Figure 7:
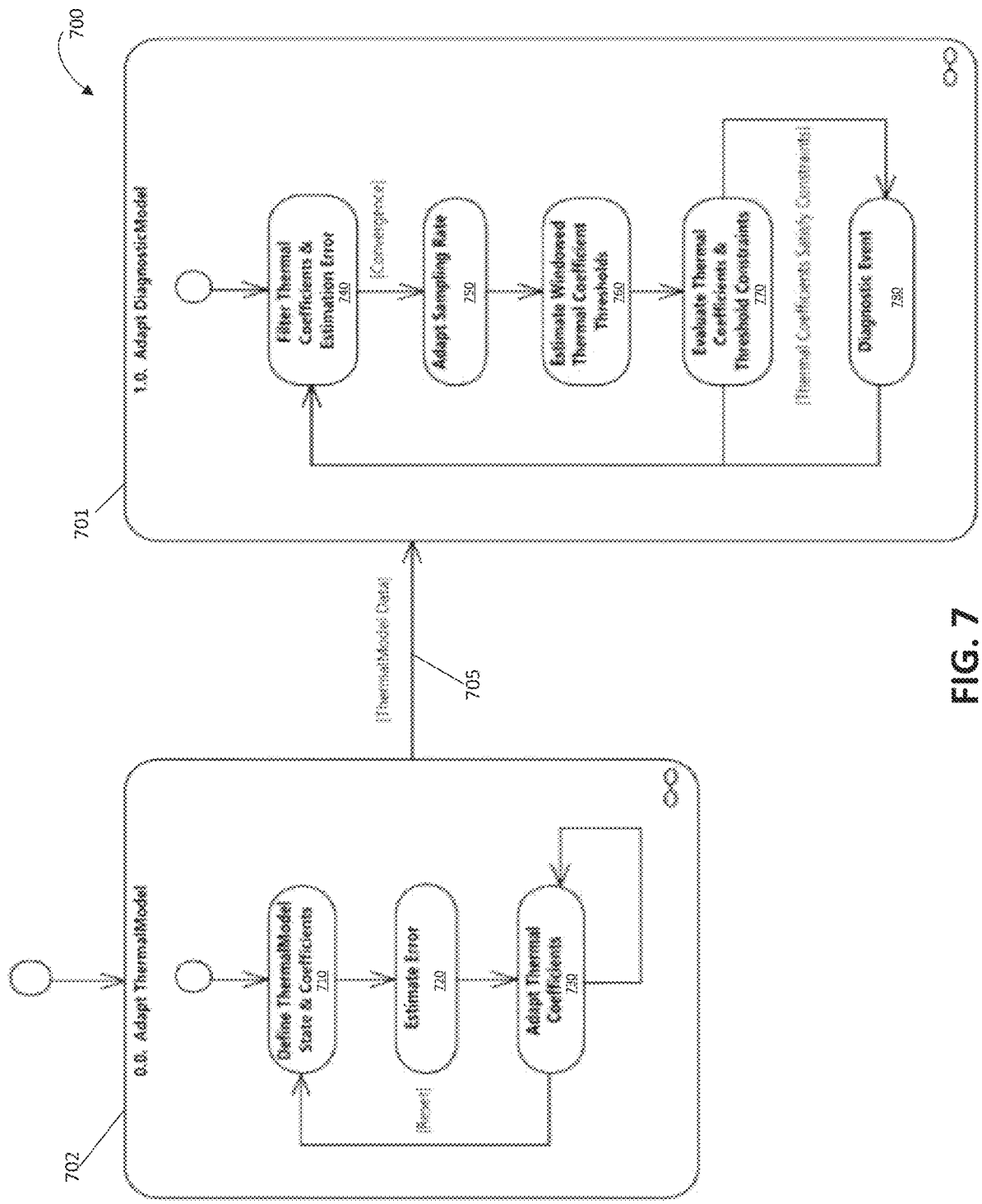
FIG. 7 is a flow diagram of a method of detecting diagnostic events in a thermal system in view of an adaptive filter bank according to an embodiment of the disclosure.

Turning to FIG. 7, a flow diagram of a method 700 of using an adaptive filter bank (e.g., adaptive filter bank 145) to detect diagnostic events in a thermal system, such as site 103 of FIG. 1, is shown. For example, the method 700 defines diagnostics events in a diagnostic model 701 to detect a change in state of representation (e.g., adapt thermal model 702) of the thermal system 103 over various time intervals, which may indicate anomalous operations. Method 700 may be performed by processing logic that may comprise hardware (e.g., circuitry, dedicated logic, programmable logic, microcode, etc.), software, firmware, or a combination thereof. In one embodiment, the adaptive filter bank logic 155 as executed by a processor of system architecture 100 may perform method 700. Although shown in a particular sequence or order, unless otherwise specified, the order of the processes can be modified. Thus, the illustrated implementations should be understood only as examples, and the illustrated processes can be performed in a different order, and some processes may be performed in parallel. Additionally, one or more processes can be omitted in various embodiments. Thus, not all processes are required in every implementation. Other process flows are possible.

In this example, diagnostics provides information related to the condition of a thermal system, such as site 101. The diagnostics may be based on an analysis of characteristics of a dynamic representation of the thermal system 101. In that regard, diagnostics events may be described as transient or persistent, and defined from continuous monitoring, local analysis, or aggregate analysis of independent thermal systems with similar design, construction or geography. The diagnostic events may indicate detection of a change in observed or estimated characteristics of the thermal system 101 which may be related to defective or anomalous operation. Absent independent means to examine a thermal system, the correlation between detection of a diagnostic event and either the presence or cause of anomalous operation cannot be confirmed. In this context, the purpose of diagnostics method 700 is to determine if a thermal system is operating in a manner which is inconsistent with normal or anticipated behavior.

In some embodiments, the diagnostic events may be generated due to evaluation of observations and estimates, over various time intervals which support classification as, for example, transient or persistent. These classifications are not exclusive or unique, as transient diagnostic events may eventually become persistent, and cyclic or quasi-periodic diagnostic events are plausible in many environments. Diagnostic evaluation over various time intervals is of practical utility, as anomalous operation may evolve over different time intervals, from seconds to months in duration. In some examples, a mode of operation of thermal devices 150 of the thermal system 101 that may cause a transient diagnostic event detection includes pump, valve, or relay failure, in hydronic heating systems, or relay failure or rapid refrigerant leaks in air-based furnace, heat pump, or air conditioning systems. In other examples, a mode of operation of the thermal devices 150 that may cause a persistent diagnostic event detection include slow boiler, pipe, or radiator water leaks, or sludge accumulation due to oxidization, in hydronic systems, or slow refrigerant leaks, damaged heat exchangers, or contaminated ducts and filters in air-based systems. A transient diagnostic event may demonstrate either cyclic or quasi-periodic or persistent behavior, which may be caused by conditions including a slow water leak in a hydronic system, as an occupant may either be aware of the defect and elect to occasionally replace water and restore normal operations or allow the defect to evolve into persistent and increasingly anomalous operation.

With reference to the diagnostic model 701 of FIG. 7, the diagnostics detect a change in state of a representation of a thermal system which may indicate anomalous operation. A dynamic representation of the state of a thermal system, including a physical or abstract thermal model, is minimally sufficient and necessary to facilitate diagnostics.

A representative thermal model appropriate for application in diagnostics includes a physical thermal model described by the following heat transfer difference equation:

$$\frac{d}{dn}(T_{i,n}) = \left(\frac{1}{C_i}\right)\frac{d}{dn}(Q_{i,c,n}) = \sum_{\substack{J=0 \\ J \neq i}}^{J} \frac{h_{Pi,j} A_{Pi,j}}{C_i}(T_{J,n-1} - T_{i,n-1}) + \sum_{k=0}^{K-1} \frac{\eta_{i,c,k}}{C_i} P_{i,c,k,n} + \frac{h_{Si} A_{Si}}{C_i} I_{i,n-1} + \frac{q_i}{C_i}$$

The heat transfer difference equation above defines a physical relationship which relates the rate of temperature change, $$\frac{d}{dt}(T_{i,n}),$$

in zone 103 i, at sample n, to observations and estimates, from which a convenient thermal coefficient vector, $\overline{w}_{i,c,n}$, in cool state c. In this context, a thermal coefficient vector is a dynamic physical representation of the state of a specific zone in a thermal system, as the constituents conveniently define normalized rates of passive, active, solar, and unobserved heat transfer, as disclosed herein.

In a typical site (such as site 101), a passive heat transfer coefficient, $\overline{w}_{p,i,n}$, in zone 103 i, at sample n, is relatively stationary, as it is related to the geometry and material properties associated with a specific zone relative to a temperature differential. In this regard, an active heat transfer coefficient, $\overline{w}_{a,i,c,n}$, in cool state c, is proportional to the efficiency, $\eta_{i,c,n}$, of an HVAC unit, and dynamic based on varying environmental conditions or design, in systems including heat pumps, multi-modal systems, and systems with variable compressor speed, or it may change due to anomalous operation. A solar heat transfer coefficient, $\overline{w}_{s,i,n}$, is relatively stationary, as it is related to the geometry and material properties associated with a specific zone relative to incident solar energy. An unobserved heat transfer coefficient, $\overline{w}_{u,i,n}$, is relatively stationary, as it is typically aggregated over a sufficient duration of time to satisfy this simplifying assumption.

In some embodiments, continuous monitoring may opportunistically or periodically evaluate a solution for observation and control of a thermal system to ensure that installation, configuration, and operation are consistent with expected behavior. A diagnostic event may be defined if communications with one or more thermal devices or cloud-based resources, including a thread, worker role, remote computing node, virtual machine, cache, table, dictionary, database, data lake, hub, or service is inaccessible or demonstrates anomalous operation, including excess latency or data corruption. Continuous monitoring may be realized as a supervisory agent with sufficient visibility and access into components of a solution which are essential to ensure that observations and estimates are defined and retained with sufficient quality, quantity, and density to facilitate local and aggregate analysis.

Turning back to FIG. 7, method 700 begins in blocks 710-730 where for a specific site 101, a thermal model, such as thermal model 140, is constructed, initialized, and adapted (e.g., using adaptive filter bank 145 of FIG. 1) on a per zone (e.g., zone 103) basis. In some embodiments, a representative thermal model appropriate for application in diagnostics include a physical thermal model described by a heat transfer difference equation as described herein. Each adaptive process per zone, produces dynamic estimate of thermal coefficient vectors, $\overline{w}_{i,c,n}$, in zone 103 i, in cool state c, at sample n, which may be used to describe and estimate the behavior of the thermal system 101. In block 750, the thermal model data that includes the thermal coefficient vectors is feed to the diagnostic model 701.

In block 740, one or more filters are applied to the thermal coefficient data based on a sampling rate. For example, the diagnostic model 701 is utilized to electively filter thermal coefficient vectors, $\overline{w}_{i,c,n}$, in zone 103 i, in cool state c, at sample n, by applying a collection of linear or nonlinear filters. This in tuns may include morphological operators to reduce noise and volatility while preserving features. In block 750, the sampling rate may be adapted and electively combined with filter operations to reduce aliasing and implement rate adaptation, converting thermal coefficient vectors, $\overline{w}_{i,c,n}$, with a sample period, $T_S$ (e.g., nominally 600-900 seconds), to an effective sample period (e.g., nominally 24 hours). In some embodiments, the representative filter operations include a Butterworth IIR filter, of order 2, with a −3 dB normalized frequency, $f_c$, less than or equal to $$\frac{T_S}{24 * 3600},$$

which has a nominal group delay of $f_c^{-1}$ samples, which may be efficiently integrated with a decimation filter to achieve an effective sample period.

In block 760, one or more estimate thermal coefficient thresholds are generated in response to responsive to the applying the filters. For example, the diagnostic model 701 is utilized to estimate thermal coefficient thresholds, $\overline{\alpha}_{i,c,n}$, in zone 103 i, in cool state c, at sample n, over a contiguous interval with a memory depth, N, or window length. This is accomplished by evaluating a sequence of thermal coefficient vectors, $\overline{w}_{i,c,n}$, after application of a filter and rate adaptation operations, to determine if a trend or pattern of behavior is observed that is sufficient to support the definition of a diagnostic event. Thermal coefficient thresholds, $\overline{\alpha}_{i,c,n}$, are defined through application of linear or nonlinear operations on thermal coefficients constrained to a specific window, where each successive window shares [0, N−1] samples with a previous window. This is conducted to determine if the thermal model 140 has demonstrated convergence to a solution with a minimal estimation error over a specific window, and at a minimum the boundary samples of a window, with sufficient confidence to justify estimation of thermal coefficient thresholds, $\overline{\alpha}_{i,c,n}$, in zone 103 i, in cool state c, at sample n. If the thermal model 140 has not sufficiently converged over a window, it may not be plausible to identify a diagnostic event over the corresponding interval.

In block 770, the thermal coefficient data is evaluated to determine if any satisfies a corresponding estimated thermal coefficient threshold. In one illustrative example, the diagnostic model 710 is utilized to evaluate an active heat transfer coefficient, $|\overline{w}_{a,i,c,n}|$, in zone 103 i, in cool state c, at sample n, of thermal coefficient vector, $\overline{w}_{i,c,n}$, bounding a specific window to determine if the coefficient adaptation demonstrates sufficient change to indicate an effective loss in efficiency, $\eta_{i,c,n}$, which exceeds a normalized efficiency threshold, $\varepsilon_{a,c}$ (e.g., nominally 0.025 per day reduction in magnitude). The efficiency threshold, $\varepsilon_{a,c}$, significantly affects the sensitivity of detection of diagnostic events, and may be determined empirically, based at least in part on the geometry, geography, materials, construction, and HVAC unit types typical of sites in a region.

Estimation of a probability density function, $P_{a,i,c,n}$, in zone 103 i, in cool state c, at sample n, with a memory depth N, of an active heat transfer coefficient, $|\overline{w}_{a,i,c,n}|$, of thermal coefficient vector, $\overline{w}_{i,c,n}$, can extract first and third quartile estimates of the associated probability distribution function, $P_{a,i,c,n}$, for application as thermal coefficient thresholds, $\overline{\alpha}_{i,c,n}$. The evaluation of an active heat transfer coefficient, $|\overline{w}_{a,i,c,n}|$, in zone 103 i, in cool state c, at sample n, of thermal coefficient vector, $\overline{w}_{i,c,n}$, bounding a specific window is done to determine if the active heat transfer coefficient, $|\overline{w}_{a,i,c,n}|$, is less than or equal to $_{min}(\overline{\alpha}_{i,c,n})$, and the active heat transfer coefficient, $|\overline{w}_{a,i,c,n-N+1}|$, is greater than or equal to $_{max}(\overline{\alpha}_{i,c,n})$. Further, it may be useful to assert that the active heat transfer coefficient, $|\overline{w}_{a,i,c,n-2N+1}|$, is also greater than or equal to $_{max}(\overline{\alpha}_{i,c,n})$, to increase confidence that an observed reduction in efficiency, $\eta_{i,c,n}$, forms a pattern or trend consistent with contiguous loss. As the rate of reduction in efficiency, $\eta_{i,c,n}$, is dependent upon the mode of operation which may cause transient or persistent diagnostic event detection, there is considerable utility in diagnostic model evaluation at various memory depths.

An additional elective restrictions may be applied to the evaluation of a sequence of thermal coefficient vector, $\overline{w}_{i,c,n}$, with a memory depth, N, including determination that a passive heat transfer coefficient, $w_{p,i,c,n}$, or a solar heat transfer coefficient, $w_{s,i,c,n}$, are statistically proximate to expected values, or that an unobserved heat transfer coefficient, $|w_{u,i,c,n}|$, may be considered to be insignificant relative to other means of heat transfer.

In block 780, alert information indicative of a diagnostic event associated with the thermal system may be generated based on the evaluation of the thresholds. For example, a diagnostic event may be identified if any of the thermal coefficients, $w_{i,c,n}$, are found to satisfy defined constraints and demonstrate anomalous operation over a contiguous interval with a memory depth, N. The alert information may be indicative of, for example, a transient diagnostic event detection that may include pump, valve, or relay failures, in hydronic heating systems, or relay failure or rapid refrigerant leaks in air-based furnace, heat pump, or air conditioning systems, a persistent diagnostic event detection that may include slow boiler, pipe, or radiator water leaks, or sludge accumulation due to oxidization, in hydronic systems, or slow refrigerant leaks, damaged heat exchangers, or contaminated ducts and filters in air-based systems, or other types of detected diagnostic events.

Diagnostic Events Detection Examples

FIGS. 8A-8D are example graphs 800, 820, 840 and 860 illustrating diagnostic event data according to an embodiment of the disclosure.

Figure 8A:
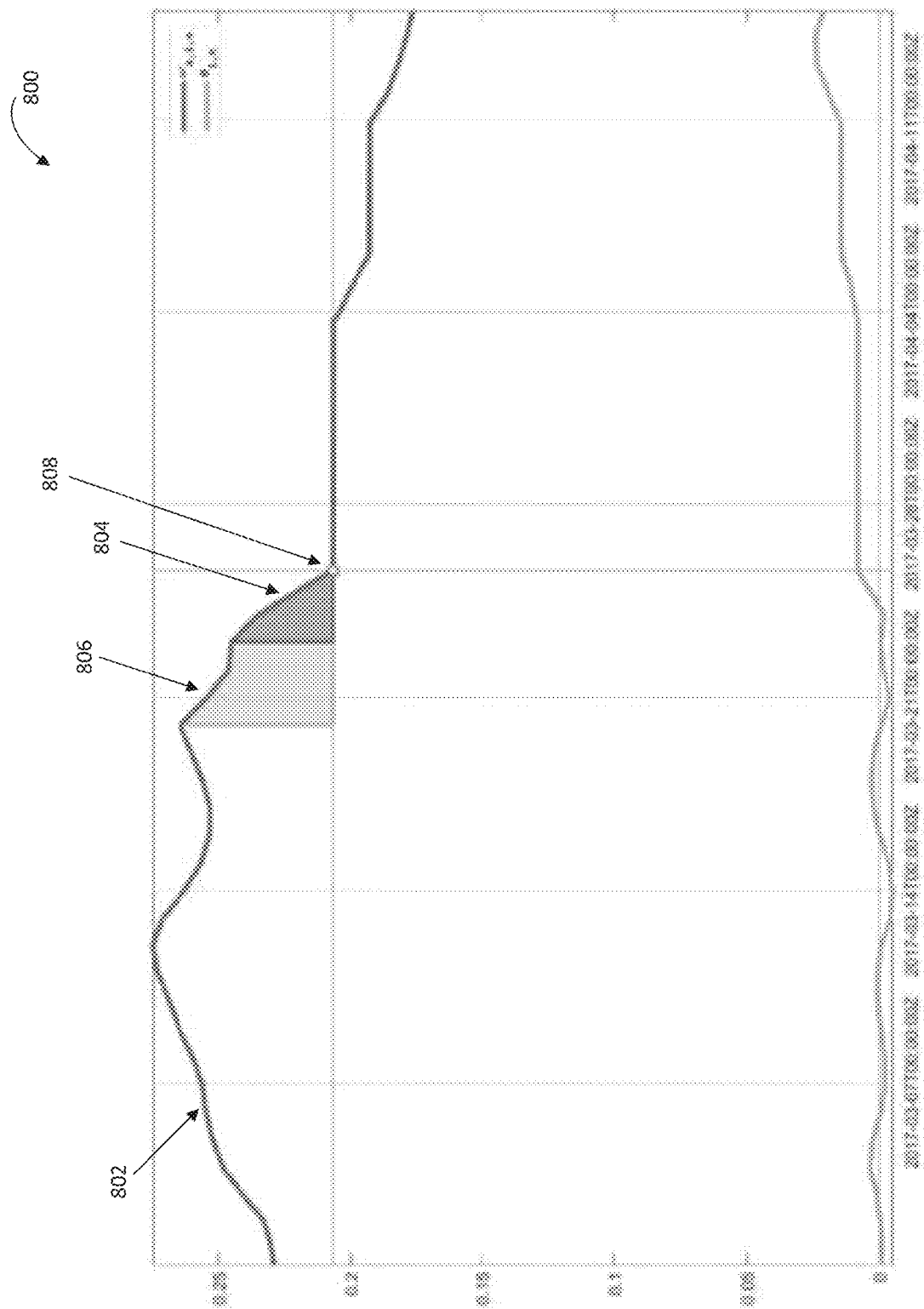
FIGS. 8A-8D are example graphs illustrating diagnostic event data according to an embodiment of the disclosure.

In FIG. 8A, graph 800 illiterates using plot points 802 an active heat transfer coefficient, $w_{a,i,c,n}$, in zone i, in cool state c, at sample n, and a thermal model temperature estimation error, $e_{i,n}$, for a site with one observable zone, at UTC, in the U.K., over 45 days of active heating in a hydronic system. A diagnostic event is detected using the techniques disclosed herein at 2017-03-26 plot point 808, with a transient local classification based on a memory depth, N, equal to 3 days, in dark shading 804. It should be noted that the trend in implicit contiguous reduction in efficiency, $\eta_{i,c,n}$, was also observed over an interval of twice the memory depth, N, equal to 6 days, in light shading 806. In this analysis, a conservative normalized efficiency threshold, $\varepsilon_{a,c}$, equal to 0.05 was applied. In a collection of 1872 sites, each with one observable zone, distributed across the U.K., over two consecutive months of hydronic heating, at least one transient local diagnostic event was detected in 38 sites. Effectively 2.03% of the sites in the collection were identified through diagnostic analysis (e.g., utilizing method 700 of FIG. 7) as demonstrating transient anomalous operation.

Figure 8B:
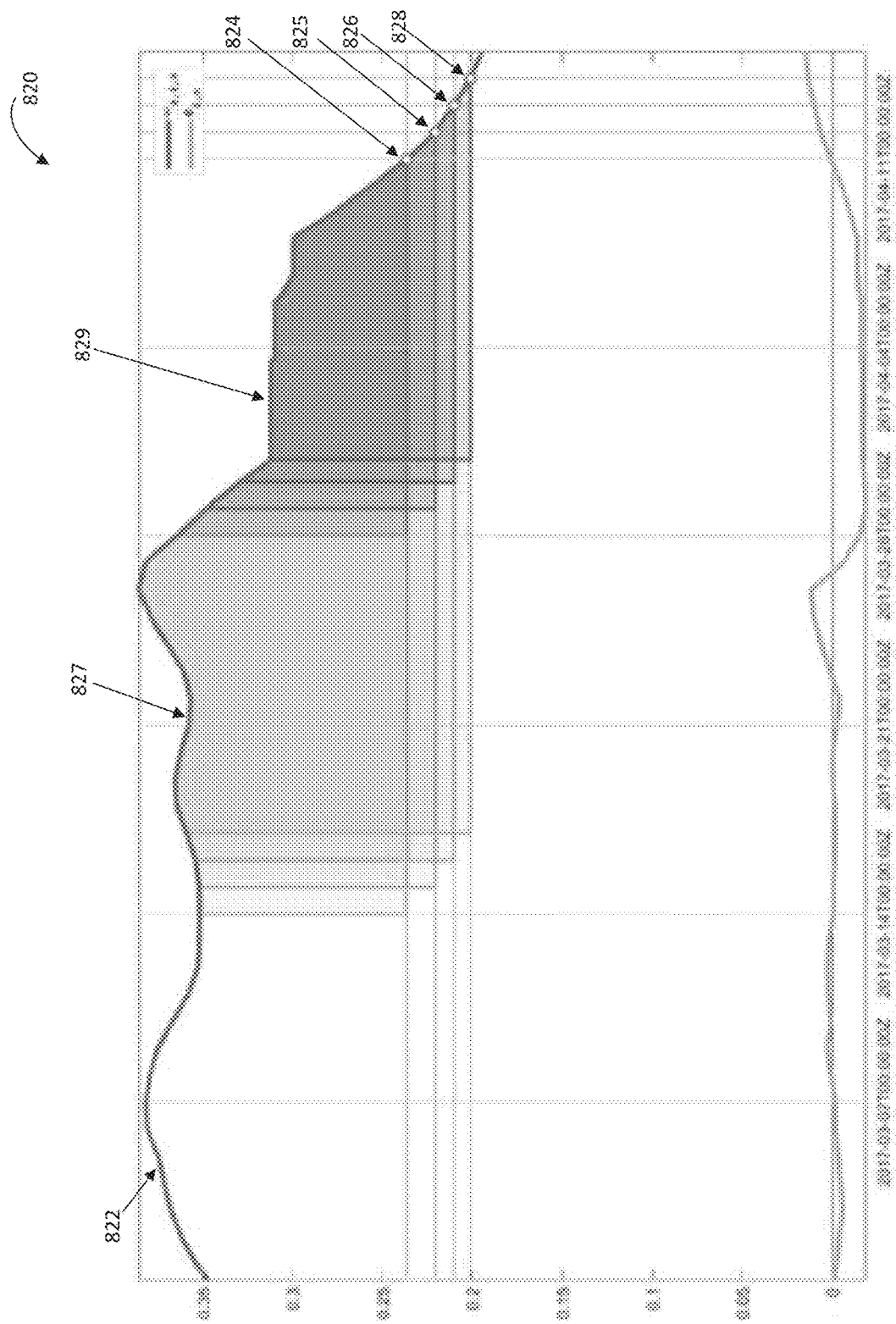

In FIG. 8B, graph 820 illiterates using plot points 822 an active heat transfer coefficient, $w_{a,i,c,n}$, in zone i, in cool state c, at sample n, and a thermal model temperature estimation error, $e_{i,n}$, for a site with one observable zone, at UTC, in the U.K., over 45 days of active heating in a hydronic system. A sequence of diagnostic events is detected using the techniques disclosed herein at 2017-04-11 plot point 824, 2017-04-12 plot point 825, 2017-04-13 plot point 826, and 2017-04-14 plot point 828, with a persistent local classification based on a memory depth, N, equal to 14 days, in dark shading 829. It should be noted that the trend in implicit contiguous reduction in efficiency, $\eta_{i,c,n}$, was also observed over an interval of twice the memory depth, N, equal to 28 days, in light shading 827. In this analysis, a conservative normalized efficiency threshold, $\varepsilon_{a,c}$, equal to 0.025 was applied. In a collection of 1872 sites, each with one observable zone, distributed across the U.K., over two consecutive months of hydronic heating, at least one persistent local diagnostic event was detected in 96 sites. Effectively 5.13% of the sites in the collection were identified through diagnostic analysis as demonstrating persistent anomalous operation.

In some embodiments, the diagnostic events 824, 825, 826, 828 may be uniquely identified or validated with improved confidence through aggregate analysis. The aggregate analysis may consider trends or statistical metrics across a collection of sites and may select sites for inclusion based on factors including similar age, geometry, geography, construction, weather, HVAC unit type, energy consumption, population density or occupant demographics. In some embodiments, the probability density functions may be estimated for properties of interest, including thermal coefficients, for a collection of sites, to and persistent aggregate diagnostic events may be independently identified in sites which demonstrate anomalous behavior relative to statistical norms. For example, sites with zones in which associated thermal models have converged to solutions with a passive heat transfer coefficient, $w_{p,i,n}$, or solar heat transfer coefficient, $w_{s,i,n}$, in zone i, at sample n, above a threshold, nominally in the 90th percentile of a probability distribution, may define persistent aggregate diagnostic events indicative of relatively poor insulation or materials which exceed a reporting threshold for anomalous operation. Similarly, an active heat transfer coefficients, $w_{a,i,c,n}$, below a threshold, nominally the 10th percentile of a probability distribution may define persistent aggregate diagnostic events indicative of relatively poor HVAC unit efficiency, $\eta_{i,c,n}$.

Figure 8C:
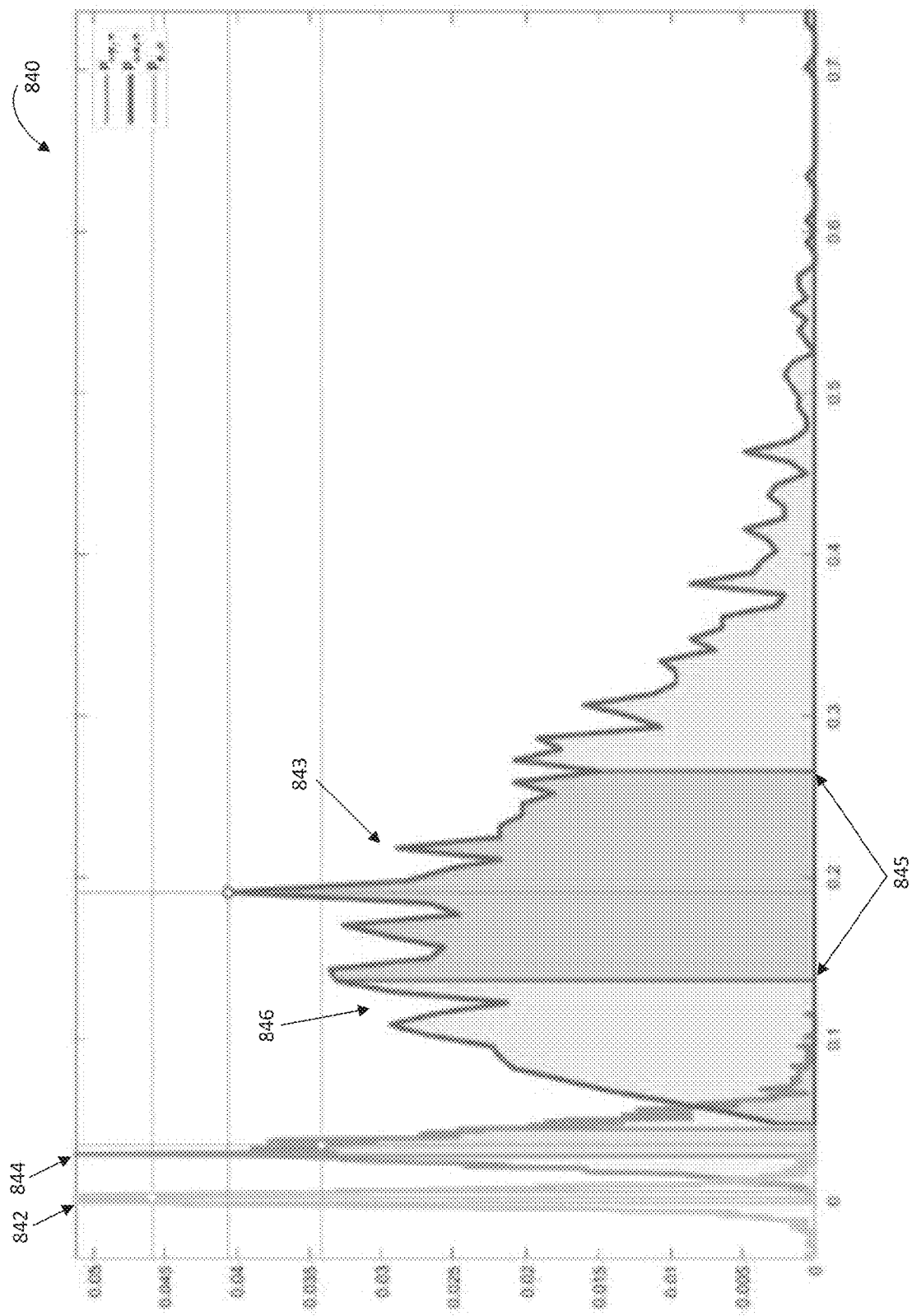

In FIG. 8C, a series of probability density functions, $P_{k,n}$, for condition k in $\{w_{p,n}, w_{a,n}, e_n\}$, at sample n, are illustrated in graph 840 at plot points 842, 844, and 846 for a collection of 1872 sites, each with one observable zone, at UTC, in the U.K., over two consecutive months of active heating in independent hydronic systems. In this example, quartiles are delimited by vertical lines 845, which bound the middle 50th percentile of the respective probability distributions, in dark shading 843. For example, an active heat transfer coefficient, $w_{a,n}$, has a probability distribution with a 25th percentile of 0.14, a 50th percentile of 0.19, and a 75th percentile of 0.275. In some embodiments, aggregate analysis may also estimate the rate of change of a metric of interest and normalize an associated metric calculated in local analysis. This may improve the confidence of diagnostic event detection using the techniques of method 700 of FIG. 7 and account for errors that may not be directly observable in a single site. Rather, they may be readily detectable and statistically significant when formed over a collection of sites.

Figure 8D:
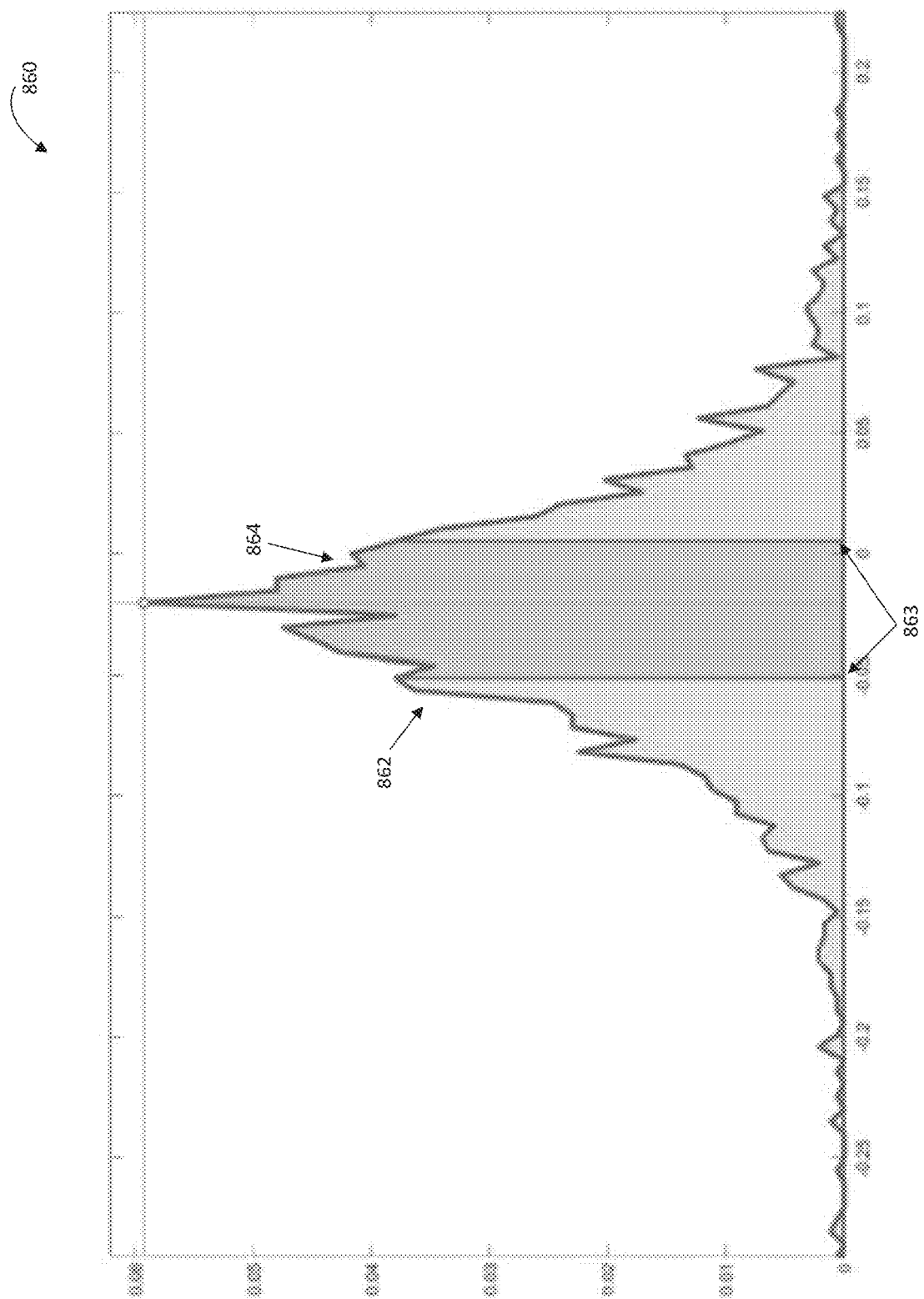

In FIG. 8D, graph 860 illustrates using plot points 862 a probability density function, $P_{\Delta w_{a,n}}$, for a relative change in an active heat transfer coefficient, $\Delta w_{a,n}$, at sample n, for a collection of 1872 sites, each with one observable zone, at UTC, in the U.K., over two consecutive months of active heating in independent hydronic systems. In this example, quartiles are delimited by vertical lines 863, which bound the middle 50th percentile of the respective probability distributions, in dark shading 864. The relative change in an active heat transfer coefficient, $\Delta w_{a,n}$, has a probability distribution with a 25th percentile of −0.05, a 50th percentile of −0.02, and a 75th percentile of 0.005. Here, aggregate analysis may improve the confidence in a local diagnostic event detection, by estimating the expectation of relative change in an active heat transfer coefficient, $\eta_{i,c,n}$, across a collection of sites, and normalizing the results obtained in the local analysis illustrated in graph 860 of FIG. 8D.

In some embodiments, the results may be normalized to account for potential sources of error, which may include forecast weather estimates, thermal device observations, or significant unobserved heat transfer potentially due to the presence of additional controlled and unobserved zones. In this example, a relative change in active heat transfer coefficient, $\Delta w_{a,n}$, has an expected value equal to −0.02, for a typical or median site, over the two consecutive months of interest. Therefore, a normalized efficiency threshold, $\varepsilon_{a,c}$, equal to 0.025, may be adjusted to account for the aggregate anticipated loss of efficiency, equal to 0.0253 in this example. Alternatively, a thermal coefficient, $\overline{w}_{i,c,n}$, or a relative change in a thermal coefficient, $\Delta \overline{w}_{i,c,n}$, may be normalized to account for any observed aggregate change.

Controller Device

Figure 9:
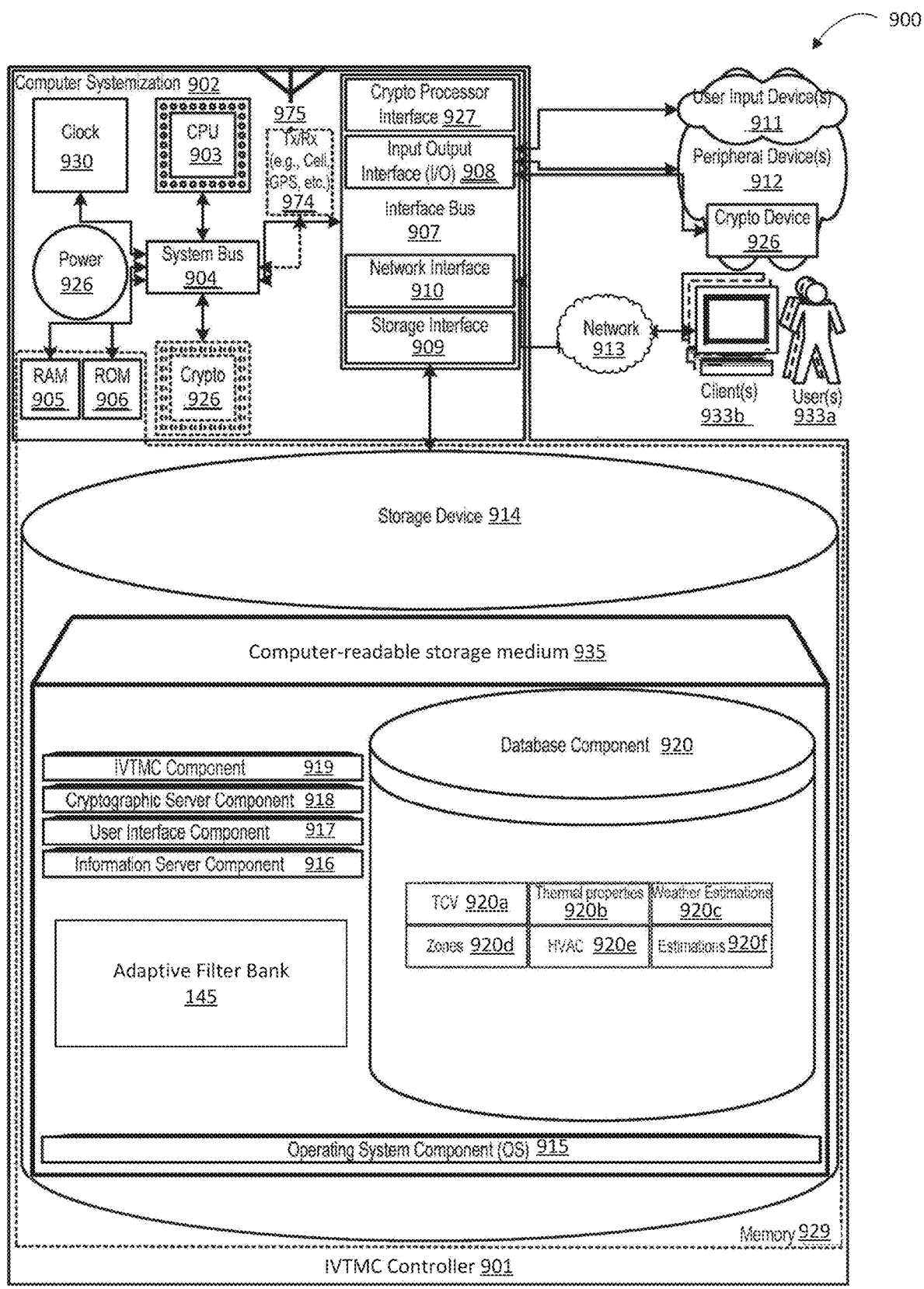
FIG. 9 is a block diagram illustrating a machine in which embodiments of the disclosure can be used.

FIG. 9 is a block diagram illustrating a machine 900 in the form of an interior volume thermal modeling and control device (hereinafter "IVTMC controller") 901 that can learn from a set of weather estimations and thermal properties to predict and control energy consumption, power consumption and/or temperatures associated to one or more volumes or enclosed environments of a thermal system. In some embodiments, the machine 900 may represent a computer system within which a set of instructions 935, for causing the machine 900 to perform any one or more of the methodologies discussed herein, may be executed. In various illustrative examples, the IVTMC controller 901 may correspond to a computing node 107 of the system 100 of FIG. 1. For example, the IVTMC controller 901 may include instructions implementing the adaptive filter bank 145 for modeling a thermal system, such as site 101 of FIG. 1.

The IVTMC controller 901 may be based on computer that may include, but are not limited to, components such as: a computer systemization 902 connected to memory 929. In one embodiment, the IVTMC controller 901 may be connected to and/or communicate with entities such as, but not limited to: one or more users 933a from user input devices 911; peripheral devices 912; an optional cryptographic processor device 926; and/or a communications network 913, such as Local Area Networks (LANs), Pico networks, Wide Area Networks (WANs), Wireless Networks (WLANs), an intranet, an extranet, the Internet, etc.

Computer systemization 902 may comprise a clock 930, central processing unit ("CPU(s)" and/or "processor(s)" (these terms are used interchangeable throughout the disclosure unless noted to the contrary)) 903, a memory 929 (e.g., a read only memory (ROM) 906, a random access memory (RAM) 905, etc.), and/or an interface bus 907, and most frequently, although not necessarily, are all interconnected and/or communicating through a system bus 904 on one or more (mother)board(s) having conductive and/or otherwise transportive circuit pathways through which instructions (e.g., binary encoded signals) may travel to effectuate communications, operations, storage, etc. The computer systemization may be connected to a power source 926; e.g., optionally the power source may be internal. Optionally, a cryptographic processor 926 and/or transceivers (e.g., ICs) 974 may be connected to the system bus. In another embodiment, the cryptographic processor and/or transceivers may be connected as either internal and/or external peripheral devices 912 via the interface bus I/O. In turn, the transceivers may be connected to antenna(s) 975, thereby effectuating wireless transmission and reception of various communication and/or sensor protocols.

The power source 926 may be of any standard form for powering small electronic circuit board devices such as the following power cells: alkaline, lithium hydride, lithium ion, lithium polymer, nickel cadmium, solar cells, and/or the like. Other types of AC or DC power sources may be used as well. In the case of solar cells, in one embodiment, the case provides an aperture through which the solar cell may capture photonic energy. The power source 926 is connected to at least one of the interconnected subsequent components of the IVTMC thereby providing an electric current to all subsequent components. In an alternative embodiment, an outside power source 926 is provided through a connection across the I/O 908 interface. For example, a USB and/or IEEE 1394 connection carries both data and power across the connection and is therefore a suitable source of power.

Interface bus(es) 907 may accept, connect, and/or communicate to a number of interface adapters, conventionally although not necessarily in the form of adapter cards, such as but not limited to: input output interfaces (I/O) 908, storage interfaces 909, network interfaces 910, and/or the like. Optionally, cryptographic processor interfaces 927 similarly may be connected to the interface bus. The interface bus provides for the communications of interface adapters with one another as well as with other components of the computer systemization.

Storage interfaces 909 may accept, communicate, and/or connect to a number of storage devices such as, but not limited to: storage devices 914, removable disc devices, and/or the like. Storage interfaces may employ connection protocols such as, but not limited to: (Ultra) (Serial) Advanced Technology Attachment (Packet Interface) ((Ultra) (Serial) ATA(PI)), (Enhanced) Integrated Drive Electronics ((E)IDE), Institute of Electrical and Electronics Engineers (IEEE) 1394, fiber channel, Small Computer Systems Interface (SCSI), Universal Serial Bus (USB), and/or the like.

Network interfaces 910 may accept, communicate, and/or connect to a communications network 913. Through a communications network 913, the IVTMC controller 901 is accessible through remote clients 933b (e.g., computers with web browsers) by users 933a. Network interfaces may employ connection protocols such as, but not limited to: direct connect, Ethernet (thick, thin, twisted pair 10/100/1000 Base T, and/or the like), Token Ring, wireless connection such as IEEE 802.11 a-x, and/or the like. Should processing requirements dictate a greater amount speed and/or capacity, distributed network controllers (e.g., Distributed IVTMC), architectures may similarly be employed to pool, load balance, and/or otherwise increase the communicative bandwidth required by the IVTMC controller 901. Further, multiple network interfaces 910 may be used to engage with various communications network 913 types. For example, multiple network interfaces may be employed to allow for the communication over broadcast, multicast, and/or unicast networks.

The Input/Output interfaces (I/O) 908 may accept, communicate, and/or connect to user input devices 911, peripheral devices 912, cryptographic processor devices 926, and/or the like. I/O may employ connection protocols such as, but not limited to: audio: analog, digital, monaural, RCA, stereo, and/or the like. User input devices 911 often are a type of peripheral device and may include: card readers, dongles, finger print readers, gloves, graphics tablets, joysticks, keyboards, microphones, mouse (mice), remote controls, retina readers, touch screens (e.g., capacitive, resistive, etc.), trackballs, trackpads, sensors (e.g., accelerometers, ambient light, GPS, gyroscopes, proximity, etc.), styluses, and/or the like.

Generally, any mechanization and/or embodiment allowing a processor to affect the storage and/or retrieval of information is regarded as memory 929. However, memory is a fungible technology and resource, thus, any number of memory embodiments may be employed in lieu of or in concert with one another. It is to be understood that the IVTMC controller 901 and/or a computer systemization may employ various forms of memory 929. For example, a computer systemization may be configured wherein the operation of on-chip CPU memory (e.g., registers), RAM, ROM, and any other storage devices are provided by a paper punch tape or paper punch card mechanism; however, such an embodiment would result in an extremely slow rate of operation. In a typical configuration, memory 929 will include ROM 906, RAM 905, and a storage device 914. A storage device 914 may be any conventional computer system storage. Storage devices may include a computer-readable storage medium 935; a drum; a (fixed and/or removable) magnetic disk drive; a magneto-optical drive; an optical drive (i.e., Blueray, CD ROM/RAM/Recordable (R)/ReWritable (RW), DVD R/RW, HD DVD R/RW etc.); an array of devices (e.g., Redundant Array of Independent Disks (RAID)); solid state memory devices (USB memory, solid state drives (SSD), etc.); other processor-readable storage mediums; and/or other devices of the like. Thus, a computer systemization generally requires and makes use of memory.

While a non-transitory computer-readable storage medium 935 is shown in the illustrative examples as a single medium, the term "computer-readable storage medium" shall include a single medium or multiple medium (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media. The non-transitory computer-readable storage medium 935 on which may include instructions encoding any one or more of the methods or functions described herein, including instructions implementing the adaptive filter bank 145 of FIG. 1 for implementing method 500 of FIG. 5, method 600 of FIG. 6 and method 700 of FIG. 7 as disclosed herein. Any component may be stored and accessed from the storage devices and/or from storage devices accessible through an interface bus. Although program components such as those in the component collection, typically, are stored in a local storage device 935, they may also be loaded and/or stored in other memory such as: remote "cloud" storage facilities accessible through a communications network; integrated ROM memory 906; via an FPGA or ASIC implementing component logic; and/or the like.

The memory 929 may contain a collection of program and/or database components and/or data such as, but not limited to: operating system component 915; information server component 916; user interface component 917; database component 920; cryptographic server component 918; IVTMC Component 919; and/or the like (i.e., collectively a component collection). The aforementioned components may be incorporated into (e.g., be sub-components of), loaded from, loaded by, or otherwise operatively available to and from the IVTMC component(s) 919.

The operating system component 915 is an executable program component facilitating the operation of the IVTMC controller 901. Typically, the operating system facilitates access of I/O, network interfaces, peripheral devices, storage devices, and/or the like. The operating system may be a highly fault tolerant, scalable, and secure system such as: Unix and Unix-like system distributions (such as AT&T's UNIX; Berkley Software Distribution (BSD) variations such as FreeBSD, NetBSD, OpenBSD, and/or the like; Linux distributions such as Red Hat, Debian, Ubuntu, and/or the like); and/or the like operating systems.

An information server component 916 is a stored program component that is executed by a CPU. The information server may be a conventional Internet information server such as, but not limited to Apache Software Foundation's Apache, Microsoft's Internet Information Server, and/or the like. A user interface component 917 is a stored program component that is executed by a CPU. The user interface component 917 may communicate to and/or with other components in a component collection, including itself, and/or facilities of the like. Most frequently, the user interface communicates with operating system component 915, other program components, and/or the like. The user interface may contain, communicate, generate, obtain, and/or provide program component, system, user, and/or data communications, requests, and/or responses. A cryptographic server component 918 is a stored program component that is executed by a CPU 903, cryptographic processor 926, cryptographic processor interface 927, cryptographic processor device 926, and/or the like. The cryptographic server component 918 facilitates the secure accessing of resources on the IVTMC and facilitates the access of secured resources on remote systems; i.e., it may act as a client and/or server of secured resources.

The database component 920 may be embodied in a database and its stored data. The database is a stored program component, which is executed by the CPU; the stored program component portion configuring the CPU to process the stored data. In one embodiment, the database component 920 includes several tables 920*a-f*. A thermal coefficient vector table (TCV) 920*a* may include fields such as, but not limited to: tcv_id, tcv_type, tcv_value, tcv_date, and/or the like. A thermal properties (TP) table 920*b* may include fields such as, but not limited to: tp_id, tp_value, hvac_id, zone_id, and/or the like. An weather estimations (WE) table 920*c* may include fields such as, but not limited to: we_id, we_time, we_value, we_serviceProvider, and/or the like. A zone table 920*d* may include fields such as, but not limited to: zone_id, thermalDevice_id, hvac_id, tvc_id, and/or the like. A HVAC table 920*e* may include fields such as, but not limited to: hvac_id, hvac_model, hvac_zoneID, hvac_avgPowerConsumption, hvac_avgEnergyEfficiency, and/or the like. An estimations (EST) table 920*f* may include fields such as, but not limited to: est_id, est_time, est_type, est_value, est_zondeID and/or the like. Any of the aforementioned tables may support and/or track multiple entities, accounts, users and/or the like.

The IVTMC component 919 may transform user weather estimations and thermal properties 920*b* and/or the like, via various components (e.g., comfort agent 120, comfort model 130, thermal model 140, thermal devices 150 and weather model 160 of FIG. 1) as described herein, into estimated temperature, estimated energy consumption, estimated power consumption and the like metrics. In one embodiment, the IVTMC component 919 takes inputs (e.g., weather estimations 920*c*, thermal properties 920*b*, and/or the like) etc., and transforms the inputs via various components (e.g., IVTMC component 919, and/or the like), into outputs (e.g., estimated temperature, estimated energy consumption, estimated power consumption and/or the like).

In the preceding, reference is made to various embodiments. However, the scope of the disclosure is not limited to the specific described embodiments. Instead, any combination of the described features and elements, whether related to different embodiments or not, is contemplated to implement and practice contemplated embodiments. Furthermore, although embodiments can achieve advantages over other possible solutions or over the prior art, whether or not a particular advantage is achieved by a given embodiment is not limiting of the scope of the disclosure. Thus, the preceding aspects, features, embodiments and advantages are merely illustrative and are not considered elements or limitations of the appended claims except where explicitly recited in a claim(s).

The various embodiments disclosed herein can be implemented as a system, method or computer program product. Accordingly, aspects can take the form of an entirely hardware embodiment, an entirely software embodiment (including firmware, resident software, micro-code, etc.) or an embodiment combining software and hardware aspects that can all generally be referred to herein as a "circuit," "module" or "system." Furthermore, aspects can take the form of a computer program product embodied in one or more computer-readable medium(s) having computer-readable program code embodied thereon.

Any combination of one or more computer-readable medium(s) can be utilized. The computer-readable medium can be a non-transitory computer-readable medium. A non-transitory computer-readable medium can be, for example, but not limited to, an electronic, magnetic, optical, electromagnetic, infrared, or semiconductor system, apparatus, or device, or any suitable combination of the foregoing. More specific examples (a non-exhaustive list) of the non-transitory computer-readable medium can include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. Program code embodied on a computer-readable medium can be transmitted using any appropriate medium, including but not limited to wireless, wireline, optical fiber cable, RF, etc., or any suitable combination of the foregoing.

Computer program code for carrying out operations for aspects of the disclosure can be written in any combination of one or more programming languages. Moreover, such computer program code can execute using a single computer system or by multiple computer systems communicating with one another (e.g., using a local area network (LAN), wide area network (WAN), the Internet, etc.). While various features in the preceding are described with reference to flowchart illustrations and/or block diagrams, a person of ordinary skill in the art will understand that each block of the flowchart illustrations and/or block diagrams, as well as combinations of blocks in the flowchart illustrations and/or block diagrams, can be implemented by computer logic (e.g., computer program instructions, hardware logic, a combination of the two, etc.). Generally, computer program instructions can be provided to a processor(s) of a general-purpose computer, special-purpose computer, or other programmable data processing apparatus. Moreover, the execution of such computer program instructions using the processor(s) produces a machine that can carry out a function(s) or act(s) specified in the flowchart and/or block diagram block or blocks.

The flowchart and block diagrams in the Figures illustrate the architecture, functionality and/or operation of possible embodiments of various embodiments of the disclosure. In this regard, each block in the flowchart or block diagrams can represent a module, segment or portion of code, which comprises one or more executable instructions for implementing the specified logical function(s). It should also be noted that, in some alternative embodiments, the functions noted in the block can occur out of the order noted in the figures. For example, two blocks shown in succession may, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It is to be understood that the above description is intended to be illustrative, and not restrictive. Many other embodiment examples are apparent upon reading and understanding the above description. Although the disclosure describes specific examples, it is recognized that the systems and methods of the disclosure are not limited to the examples described herein, but can be practiced with modifications within the scope of the appended claims. Accordingly, the specification and drawings are to be regarded in an illustrative sense rather than a restrictive sense. The scope of the disclosure should, therefore, be determined with reference to the appended claims, along with the full scope of equivalents to which such claims are entitled.

What is claimed is:

1. A method, comprising:
receiving, by a controller device, thermal coefficient data at an adaptive filter bank to characterize heat transfer of a volume of a thermal system;
generating, by the controller device, reference signal data indicating an estimate of a rate of temperature change in the volume based on at least the adaptive filter bank;
receiving, by the controller device, primary signal data based at least on an observed rate of the temperature change in the volume;
determining, by the controller device, an estimation error for the reference signal data with respect to the primary signal data associated with the volume; and
modifying, by the controller device, the thermal coefficient data in view of the estimation error.

2. The method of claim 1, wherein the adaptive filter bank comprises a plurality of infinite impulse response filters.

3. The method of claim 1, wherein the solution indicates a convergence between the reference signal data and the primary signal data associated with the volume.

4. The method of claim 1, wherein the thermal coefficient data comprises data associated with at least one of: an active, passive, solar irradiance or unobserved heat transfer rate of the volume.

5. The method of claim 1, further comprising:
receiving the primary data based on a thermal control unit associated with the volume.

6. The method of claim 1, wherein generating the reference signal data further comprises:
aggregating an estimate of the primary signal data for a determined time period; and
inserting a delay in a signal path associated with the aggregated primary signal data.

7. The method of claim 1, further comprising:
determining the estimation error based on a difference between the reference signal data the primary signal data.

8. A system, comprising:
a memory to store a plurality of thermal coefficient data; and
a controller device, operatively coupled to the memory, to:
receive thermal coefficient data at an adaptive filter bank to characterize heat transfer of a volume of a thermal system;
generate reference signal data indicating an estimate of a rate of temperature change in the volume based on at least the adaptive filter bank;
receive primary signal data based at least on an observed rate of the temperature change in the volume;
determine an estimation error for the reference signal data with respect to the primary signal data associated with the volume; and
modify the thermal coefficient data in view of the estimation error.

9. The system of claim 8, wherein the adaptive filter bank comprises a plurality of infinite impulse response filters.

10. The system of claim 8, wherein the solution indicates a convergence between the reference signal data and the primary signal data associated with the volume.

11. The system of claim 8, wherein the thermal coefficient data comprises data associated with at least one of: an active, passive, solar irradiance or unobserved heat transfer rate of the volume.

12. The system of claim 8, wherein the controller device is further to:
receive the primary data based on a thermal control unit associated with the volume.

13. The system of claim 8, wherein to generate the reference signal data, the controller device is further to:
aggregate an estimate of the primary signal data for a determined time period; and
insert a delay in a signal path associated with the aggregated primary signal data.

14. The system of claim 8, wherein the processor is further to:
determine the estimation error based on a difference between the reference signal data the primary signal data.

15. A non-transitory computer-readable storage medium comprising executable instructions that when executed, by a controller device, cause the controller device to:
receive, by the controller device, thermal coefficient data at an adaptive filter bank to characterize heat transfer of a volume of a thermal system;
generate reference signal data indicating an estimate of a rate of temperature change in the volume based on at least the adaptive filter bank;
receive primary signal data based at least on an observed rate of the temperature change in the volume;
determine an estimation error for the reference signal data with respect to the primary signal data associated with the volume; and
modify the thermal coefficient data in view of the estimation error.

16. The non-transitory computer-readable storage medium of claim 15, wherein the adaptive filter bank comprises a plurality of infinite impulse response filters.

17. The non-transitory computer-readable storage medium of claim 15, wherein the solution indicates a convergence between the reference signal data and the primary signal data associated with the volume.

18. The non-transitory computer-readable storage medium of claim 15, wherein the thermal coefficient data comprises data associated with at least one of: an active, passive, solar irradiance or unobserved heat transfer rate of the volume.

19. The non-transitory computer-readable storage medium of claim 15, wherein the controller device is further to:
  receive the primary data based on a thermal control unit associated with the volume.

20. The non-transitory computer-readable storage medium of claim 15, wherein to generate the reference signal data, the controller device is further to:
  aggregate an estimate of the primary signal data for a determined time period; and
  insert a delay in a signal path associated with the aggregated primary signal data.

* * * * *